(12) United States Patent
Hoshi

(10) Patent No.: US 11,043,557 B2
(45) Date of Patent: Jun. 22, 2021

(54) SEMICONDUCTOR DEVICE

(71) Applicant: Fuji Electric Co., Ltd., Kanagawa (JP)

(72) Inventor: Yasuyuki Hoshi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/864,386

(22) Filed: May 1, 2020

(65) Prior Publication Data

US 2020/0411643 A1 Dec. 31, 2020

(30) Foreign Application Priority Data

Jun. 27, 2019 (JP) .............................. JP2019-119434

(51) Int. Cl.
*H01L 29/06* (2006.01)
*H01L 29/78* (2006.01)
*H01L 29/43* (2006.01)

(52) U.S. Cl.
CPC ........ *H01L 29/0696* (2013.01); *H01L 29/435* (2013.01); *H01L 29/7815* (2013.01)

(58) Field of Classification Search
CPC ............... H01L 29/0696; H01L 29/435; H01L 29/07815
USPC ....................................................... 257/330
See application file for complete search history.

(56) References Cited

U.S. PATENT DOCUMENTS

| | | | | |
|---|---|---|---|---|
| 2007/0052014 A1* | 3/2007 | Takahashi | ........... | H01L 29/0696 257/330 |
| 2010/0123192 A1* | 5/2010 | Burke | ................. | H01L 29/7813 257/334 |
| 2010/0140695 A1* | 6/2010 | Yedinak | .............. | H01L 29/7811 257/334 |
| 2010/0140697 A1* | 6/2010 | Yedinak | .............. | H01L 29/7811 257/334 |
| 2010/0207205 A1* | 8/2010 | Grebs | ................. | H01L 29/8725 257/334 |
| 2013/0168730 A1* | 7/2013 | Ashida | ................ | H01L 29/7394 257/139 |
| 2014/0319603 A1* | 10/2014 | Kawaguchi | ......... | H01L 29/7813 257/330 |
| 2015/0115285 A1* | 4/2015 | Kinoshita | ........... | H01L 29/7839 257/77 |
| 2015/0333060 A1* | 11/2015 | Decker | ............... | H01L 29/7827 257/392 |

(Continued)

FOREIGN PATENT DOCUMENTS

| | | |
|---|---|---|
| JP | 2017-079324 A | 4/2017 |
| JP | 2018-006360 A | 1/2018 |

*Primary Examiner* — Sheikh Maruf
(74) *Attorney, Agent, or Firm* — Chen Yoshimura LLP

(57) ABSTRACT

In an edge termination region, a second gate runner for a current sensor is formed between a first gate runner for a main semiconductor device and an active region. The second gate runner surrounds the periphery of the active region in a substantially rectangular shape having an opening. One end of the second gate runner is connected to all of the gate electrodes of the current sensor, and the other end is connected to the first gate runner at between a gate pad and an OC pad. This makes it possible to increase the gate capacitance of the current sensor as the current sensor switches ON and OFF when a pulse-shaped gate voltage is applied to the gate pad by an amount proportional to the surface area of the second gate runner.

10 Claims, 16 Drawing Sheets

(56) References Cited

U.S. PATENT DOCUMENTS

| 2016/0079377 | A1* | 3/2016 | Hutzler | H01L 29/7813 |
| | | | | 257/334 |
| 2017/0110544 | A1* | 4/2017 | Hoshi | H01L 29/2003 |
| 2017/0111037 | A1* | 4/2017 | Shiigi | H01L 29/7802 |
| 2017/0352733 | A1* | 12/2017 | Hoshi | H01L 29/408 |

* cited by examiner

SEMICONDUCTOR DEVICE

BACKGROUND OF THE INVENTION

Technical Field

The present invention relates to a semiconductor device.

Background Art

Silicon (Si) has conventionally been used as a material for power semiconductor devices for controlling high voltages and high currents. There are various types of power semiconductor devices, such as bipolar transistors, insulated-gate bipolar transistors (IGBTs), and metal-oxide-semiconductor field-effect transistors (MOSFETs; MOS field-effect transistors which have an insulated gate constituted by a three-layer metal-oxide-semiconductor structure), and these devices are used for different purposes according to the use case.

For example, bipolar transistors and IGBTs offer higher current densities and make it possible to work with higher currents than MOSFETs but cannot be switched at high speeds. More specifically, bipolar transistors are limited to being used at switching frequencies on the order of several kHz, and IGBTs are limited to being used at switching frequencies on the order of several dozen kHz. On the other hand, power MOSFETs have lower current densities and make it more difficult to work with high currents than bipolar transistors and IGBTs but can be operated at high switching speeds on the order of several MHz.

Moreover, unlike in IGBTs, in MOSFETs the parasitic diode formed by the p-n junction between the p-type base region and the n⁻ drift region can be used as a freewheeling diode for protecting the MOSFET. Thus, when used as devices for inverters, MOSFETs can be used without having to add and connect external freewheeling diodes to the MOSFETs, and therefore MOSFETs have attracted attention for economic reasons as well.

Furthermore, there is strong commercial demand for power semiconductor devices that can both handle large currents and offer good high-speed performance. A great deal of effort has been expended improving IGBTs and power MOSFETs in these respects, and currently, these devices have been developed to substantially near the limits of the materials being used. Therefore, semiconductor materials that can replace silicon in power semiconductor devices are being researched, and silicon carbide (SiC) has attracted attention as a semiconductor material that could potentially make it possible to make (manufacture) next-generation power semiconductor devices with low on-voltages and excellent high-speed and high-temperature performance.

Silicon carbide is a semiconductor material with exceptional chemical stability that also has a wide bandgap of 3 eV and can be used as a semiconductor in an extremely stable manner even at high temperatures. Moreover, silicon carbide has a maximum electric field strength of at least an order of magnitude greater than that of silicon and therefore shows potential as a semiconductor material that could make it possible to sufficiently reduce on-resistance. These advantageous properties of silicon carbide are also exhibited by other semiconductors that have a wider bandgap than silicon (hereinafter, "wide-bandgap semiconductors").

Next, the structure of a conventional semiconductor device will be described using a MOSFET in which silicon carbide (SiC) is used as a wide-bandgap semiconductor as an example. FIG. 16 is a plan view illustrating the layout of the conventional semiconductor device as viewed from the front surface side of a semiconductor substrate. In FIG. 16, the portion between the two rectangles illustrated in dashed lines is a gate runner 123. The portions between the sets of two straight lines respectively illustrated in dashed lines between the gate runner 123 and a gate pad 121b and an OC pad 122 are polysilicon connecting portions 123a and 123b.

The conventional semiconductor device 120 illustrated in FIG. 16 includes, in an active region 101 of a same semiconductor substrate 110 made of silicon carbide, a main semiconductor device 111 and one or more circuits for protecting and controlling the main semiconductor device 111. The main semiconductor device 111 is a vertical MOSFET and is constituted by a plurality of unit cells (functional units of the device; not illustrated in the figure) arranged next to one another in an effective region (hereinafter, "main effective region") 101a of the active region 101.

A source pad 121a of the main semiconductor device 111 is formed on the front surface of the semiconductor substrate 110 in the main effective region 101a. The circuits for protecting and controlling the main semiconductor device 111 are arranged in a region (hereinafter, "main non-effective region") 101b of the active region 101 that does not include the main effective region 101a. None of the unit cells of the main semiconductor device 111 are arranged in this main non-effective region 101b.

The surface area of the main non-effective region 101b is greater than that of a main non-effective region in a semiconductor device which does not include circuits for protecting and controlling the main semiconductor device 111 (a semiconductor device in which only the gate pad is arranged in the main non-effective region). Examples of circuits for protecting and controlling the main semiconductor device 111 include high-functionality units such as a current sensor 112, a temperature sensor (not illustrated in the figure), an overvoltage protection unit (not illustrated in the figure), and an arithmetic circuit (not illustrated in the figure), for example.

The current sensor 112 is a vertical MOSFET which includes unit cells that have the same structure as in the main semiconductor device 111 but are in fewer in number than the number of unit cells in the main semiconductor device 111. The current sensor 112 is arranged separated from the main semiconductor device 111. The current sensor 112 operates under the same conditions as the main semiconductor device 111 and detects overcurrent (OC) flowing through the main semiconductor device 111.

The unit cells of the current sensor 112 are arranged in a region (hereinafter, "sense effective region") 112a within the region of the semiconductor substrate 110 that is covered by an electrode pad (hereinafter, "OC pad") 122 of the current sensor 112. Within the region of the semiconductor substrate 110 that is covered by the OC pad 122, a region (hereinafter, "sense non-effective region") 112b that does not include the sense effective region 112a is a region in which none of the unit cells of the current sensor 112 are arranged and which does not function as the current sensor 112.

The electrode pads other than the source pad 121a are formed on the front surface of the semiconductor substrate 110 with a field insulating film (not illustrated in the figure) interposed therebetween in the main non-effective region 101b. In FIG. 16, the source pad 121a, the gate pad 121b, and the OC pad 122 are respectively labeled S, G, and OC. The gate runner 123 is a polysilicon (poly-Si) layer which is arranged on the front surface of the semiconductor substrate 110 with a field insulating film interposed therebetween in an edge termination region 102.

The gate runner 123 surrounds the periphery of the active region 101 in a substantially rectangular shape. The gate runner 123 is electrically connected to the gate pad 121*b* via a connecting portion constituted by a polysilicon layer (hereinafter, a "polysilicon connecting portion) 123*a*. The gate runner 123 is connected to all of the gate electrodes (not illustrated in the figure) of the main semiconductor device 111. The gate runner 123 is electrically connected to all of the gate electrodes (not illustrated in the figure) of the current sensor 112 via a polysilicon connecting portion 123*b*.

Moreover, when working with higher currents, trench gate structures in which channels (inversion layers) form running along the sidewalls of gate trenches in a direction orthogonal to the front surface of the semiconductor substrate become more advantageous from a cost perspective than planar gate structures in which channels form running along the front surface of the semiconductor substrate. This is because trench gate structures make it possible to increase the density of unit cells (the structural unit of the device) per unit area, thereby making it possible to increase the current density per unit area.

Increasing the current density of the device results in a proportional increase in the rate at which temperature increases as a function of the volume occupied by a unit cell, and therefore a dual-surface cooling structure becomes necessary in order to improve discharge efficiency and achieve more stable and reliable operation. Furthermore, in consideration of reliability, it becomes necessary to have high-functionality structures in which high-functionality units such as current sensors, temperature sensors, and overvoltage protection units are arranged as circuits for protecting and controlling the main semiconductor device on the same semiconductor substrate as the vertical MOSFET which constitutes the main semiconductor device.

One device that has been proposed as a conventional semiconductor device is an SiC-MOSFET made of silicon carbide and is a semiconductor device which includes high-functionality units such as a current sensor, a temperature sensor, and an overvoltage protection unit on the same semiconductor substrate as a main semiconductor device, with a gate runner that is arranged in a layout passing through the center of the chip being electrically connected to gate electrodes that are arranged in a stripe-shaped layout, thereby reducing gate resistance (see Patent Document 1, for example).

In another device that has been proposed as a conventional semiconductor device, gate trenches in a main effective region are stripe-shaped while gate trenches in a sense effective region are substantially matrix-shaped, thereby making an area over which a gate insulating film contacts a base region in the sense effective region greater than an area over which a gate insulating film contacts a base region in the main effective region and also making the gate capacitance of the sense effective region greater than the gate capacitance of the main effective region (see Patent Document 2, for example).

RELATED ART DOCUMENTS

Patent Documents

Patent Document 1: Japanese Patent Application Laid-Open Publication No. 2017-079324

Patent Document 2: Japanese Patent Application Laid-Open Publication No. 2018-006360

SUMMARY OF THE INVENTION

However, in the conventional semiconductor device 120 (see FIG. 16), the surface area of the sense effective region 112*a* is less than $\frac{1}{1000}$ of the surface area of the main effective region 101*a* and is thus smaller than the surface area of the main effective region 101*a*. Therefore, the gate capacitance of the current sensor 112 is less than the gate capacitance of the main semiconductor device 111, and the tolerance of the current sensor 112 to electrostatic discharge (ESD) is less than the ESD tolerance of the main effective region 101*a*. As a result, the gate insulating film of the current sensor 112 is more prone to breakdown than the gate insulating film of the main semiconductor device 111.

In order to solve the problems in the conventional technologies described above, the present invention aims to provide a semiconductor device that includes a current sensor on the same semiconductor substrate as a main semiconductor device and that makes it possible to improve the ESD tolerance of the current sensor.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: a semiconductor substrate made of a semiconductor having a wider bandgap than silicon, the semiconductor substrate having defined therein, in a plan view, a first device region and a second device region arranged side-by-side with each other, the first and second device regions together defining an active region, and an edge termination region surrounding the active region and located at an entire periphery of the semiconductor substrate; a first insulated-gate field-effect transistor formed in the semiconductor substrate, the first insulated-gate field-effect transistor having a plurality of cells that respectively have a plurality of gate electrodes; a first source pad for the first insulated-gate field-effect transistor formed on a first principal surface of the semiconductor substrate, the first source pad and the first insulating-gate field-effect transistor being located in the first device region in the plan view; a second insulated-gate field-effect transistor formed in the semiconductor substrate, the second insulated-gate filed-effect transistor having a plurality of cells that respectively have a plurality of gate electrodes and that have a same cell structure as the plurality of cells of the first insulated-gate field-effect transistor, the number of the cells in the second insulated-gate field-effect transistor being smaller than the number of the cells in the first insulated-gate field-effect transistor; a second source pad for the second insulated-gate field-effect transistor formed separated from the first source pad on the first principal surface of the semiconductor substrate, the second source pad and the second insulated-gate field-effect transistor being located in the second device region in the plan view; a first gate runner formed in the edge termination region on the first principal surface of the semiconductor substrate, the first gate runner being connected to all of the gate electrodes of the plurality of cells of the first insulated-gate field-effect transistor in the first device region; a second gate runner formed in the edge termination region on the first principal surface of the semiconductor substrate, one end of the second gate runner being connected to all of the gate electrodes of the plurality of cells of the second insulated-gate field-effect transistor in the second device region; a gate pad formed in the second device region, separated from the second source pad, on the first principal surface of the semiconductor substrate, the gate pad being connected to the first gate runner so as to be connected to all of the gate electrodes of the plurality of cells of the first insulated-gate field-effect transistors; and a drain electrode that makes ohmic contact with a second principal surface, opposite to the first principal surface, of the semiconductor substrate and that is shared by the first insulated-gate field-effect transistor and the second insulated-gate field-effect transistor, wherein the second gate runner extends from said one end thereof along a portion of a boundary between the second device region and the edge termination region and along an entire boundary between the first device region and the edge termination region, and wherein another end of the second gate runner is connected to the first gate runner so that the gate electrodes of the plurality of cells of the second insulated-gate field-effect transistor are electrically connected to the gate pad via the second gate runner and the first gate runner.

In the above-mentioned semiconductor device, the second gate runner may surround a substantially entire periphery of the active region with said one end and said another end both terminating adjacent to a boundary between the second device region and the edge termination region, and the another end of the second gate runner may be connected to the first gate runner at a position adjacent to the boundary between the second device region and the edge termination region that is located between the gate pad and the second source pad.

The above-mentioned the semiconductor device may further comprises a gate resistor inserted in the second gate runner, the gate resistor being formed in the edge termination region on the first principal surface of the semiconductor substrate.

Here, the second gate runner may be a polysilicon pattern, and the gate resistor may be constituted by a portion of the polysilicon pattern of the second gate runner.

Moreover, the above-mentioned semiconductor device may further comprise an inductor inserted in the second gate runner, the inductor being formed in the edge termination region on the first principal surface of the semiconductor substrate.

Here, the inductor may be a coil constituted by a helix-shaped metal film that is formed on the first principal surface of the semiconductor substrate in the edge termination region.

In the above-mentioned semiconductor device, the first gate runner may extend along an entire boundary between the active region and the edge termination region and surrounds an entire periphery of the active region, and the second gate runner may be arranged between the first gate runner and the active region.

Moreover, in the above-mentioned semiconductor device, the plurality of cells of the second insulated-gate field-effect transistor may be arranged within a region of the semiconductor substrate that is covered by the second source pad in the plan view.

Furthermore, in the above-mentioned semiconductor, the second insulated-gate field-effect transistor may detect overcurrent flowing through the first insulated-gate field-effect transistor.

According to at least some of the aspects of the semiconductor device described above, it becomes possible to increase the gate capacitance of the second insulated-gate field-effect transistor by an amount proportional to the surface area of the second gate runner for the second insulated-gate field-effect transistor.

Furthermore, a transient voltage produced as the second insulated-gate field-effect transistor switches ON and OFF when a pulse-shaped gate voltage is applied to the gate pad can be reduced by an amount proportional to this increase in the gate capacitance of the second insulated-gate field-effect transistor.

The semiconductor device according to the present invention includes a current sensor on the same semiconductor substrate as a main semiconductor device and exhibits the advantageous effect of making it possible to improve the ESD tolerance of the current sensor.

It is to be understood that both the foregoing general description and the following detailed description are exemplary and explanatory, and are intended to provide further explanation of the invention as claimed.

DETAILED DESCRIPTION OF EMBODIMENTS

Figure 1:
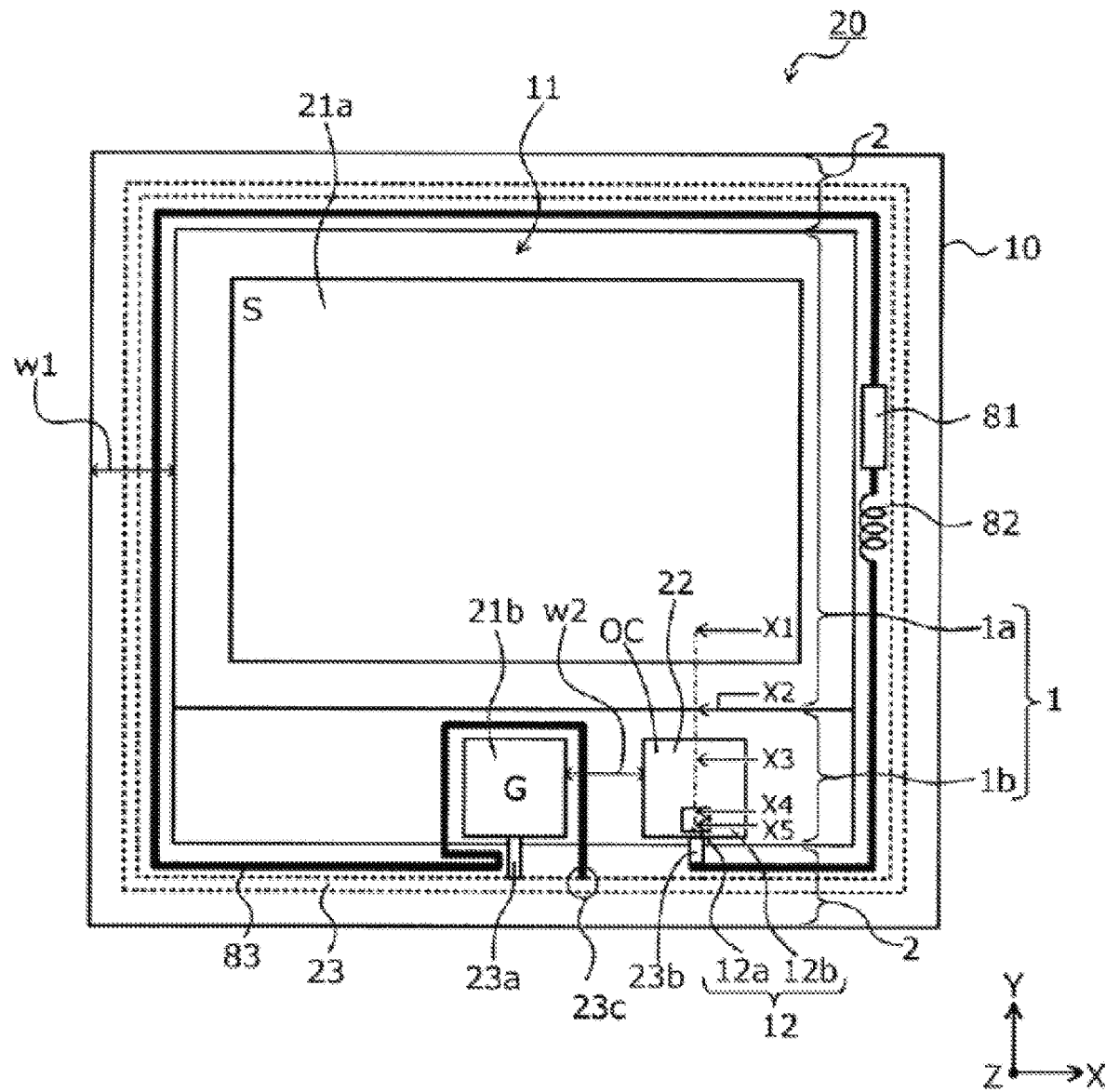
FIG. 1 is a plan view illustrating the layout of a semiconductor device according to Embodiment 1 as viewed from the front surface side of a semiconductor substrate.

Preferred embodiments of a semiconductor device according to the present invention will be described in detail below with reference to the attached drawings. In the present specification and the attached drawings, the letters "n" and "p" are used to indicate whether the majority carriers in a layer or region are electrons or holes, respectively. Moreover, the symbols +and − are appended to the letters n and p to indicate layers or regions having a higher impurity concentration or lower impurity concentration, respectively, than layers or regions in which the + and − symbols are not appended. Furthermore, in the following descriptions of the embodiments and the attached drawings, the same reference characters are used to indicate components that are the same, and redundant descriptions of such components will be omitted.

Embodiment 1

A semiconductor device according to Embodiment 1 is made using a semiconductor that has a wider bandgap than silicon (Si) (a wide-bandgap semiconductor) as the semiconductor material. The structure of the semiconductor device according to Embodiment 1 will be described using an example in which silicon carbide (SiC) is used as the wide-bandgap semiconductor, for example. FIG. 1 is a plan view illustrating the layout of the semiconductor device according to Embodiment 1 as viewed from the front surface side of a semiconductor substrate. In FIG. 1, the portion between the two rectangles illustrated in dashed lines is a first gate runner 23. A second gate runner 83 is illustrated by the single continuous bold line.

A semiconductor device 20 according to Embodiment 1 and illustrated in FIG. 1 includes, in an active region 1 of a same semiconductor substrate (semiconductor chip) 10, a main semiconductor device (first insulated-gate field-effect transistor) 11 and one or more circuits for protecting and controlling the main semiconductor device 11. The main semiconductor device 11 is a vertical MOSFET in which, in the ON state, drift current flows in a depth direction Z of the semiconductor substrate 10. The main semiconductor device 11 is constituted by a plurality of unit cells (the functional unit of the device) which are connected in parallel to one another via a source pad (first source pad) 21a.

The unit cells of the main semiconductor device 11 are arranged next to one another in directions parallel to the front surface of the semiconductor substrate 10. The main semiconductor device 11 performs the primary function of the semiconductor device 20 according to Embodiment 1. The main semiconductor device 11 is arranged in an effective region (main effective region; first device region) 1a of the active region 1. The main effective region 1a is a region through which the primary current of the main semiconductor device 11 flows when the main semiconductor device 11 is ON. The main effective region 1a has a substantially rectangular planar shape, for example, and occupies the majority of the surface area of the active region 1.

The circuits for protecting and controlling the main semiconductor device 11 are high-functionality units such as a current sensor (second insulated-gate field-effect transistor) 12, a temperature sensor (not illustrated in the figure), an overvoltage protection unit (not illustrated in the figure), and an arithmetic circuit (not illustrated in the figure) and are arranged in a main non-effective region (second device region) 1b of the active region 1. The main non-effective region 1b is a region in which none of the unit cells of the main semiconductor device 11 are arranged and does not function as the main semiconductor device 11. The main non-effective region has a substantially rectangular planar shape, for example, and is arranged between the main effective region 1a and an edge termination region (termination region) 2.

The source pad (electrode pad) 21a of the main semiconductor device 11 is arranged on the front surface of the semiconductor substrate 10 in the main effective region 1a. The main semiconductor device 11 has greater current-carrying capability than the other circuit portions. Therefore, the source pad 21a of the main semiconductor device 11 has substantially the same planar shape as the main effective region 1a and covers substantially the entire main effective region 1a. The source pad 21a of the main semiconductor device 11 is arranged separated from electrode pads other than the source pad 21a.

The electrode pads other than the source pad 21a are arranged separated from the edge termination region 2 and separated from one another on the front surface of the semiconductor substrate 10 in the main non-effective region 1b. The electrode pads other than the source pad 21a are a gate pad 21b of the main semiconductor device 11, an electrode pad (hereinafter, "OC pad" (second source pad)) 22 of the current sensor 12, electrode pads of the temperature sensor (not illustrated in the figure), an electrode pad of the overvoltage protection unit (not illustrated in the figure), an electrode pad of the arithmetic circuit (not illustrated in the figure), and the like.

The electrode pads other than the source pad 21a have a substantially rectangular planar shape, for example, and have the surface areas required to bond terminal pins 48b (described later) or wires thereto. FIG. 1 depicts a case in which the electrode pads other than the source pad 21a are arranged in a line along the boundary between the main non-effective region 1b and the edge termination region 2 (and the same applies to FIG. 15 as well). Moreover, in FIG. 1 the source pad 21a, the gate pad 21b, and the OC pad 22 are respectively depicted by the rectangular shapes labeled S, G, and OC (and the same applies to FIG. 15 as well).

The current sensor 12 operates under the same conditions as the main semiconductor device 11 and has the function of detecting overcurrent (OC) flowing through the main semiconductor device 11. The current sensor 12 is arranged separated from the main semiconductor device 11. The current sensor 12 is a vertical MOSFET which includes unit cells that have the same structure as in the main semiconductor device 11 but are in fewer in number (approximately 10 cells, for example) than the number of unit cells in the main semiconductor device 11 (approximately 1,000 cells or more, for example), and the current sensor 12 has a smaller surface area than the main semiconductor device 11.

The unit cells of the current sensor 12 are arranged in a region (hereinafter, "sense effective region") 12a within the region of the semiconductor substrate 10 that is covered by the OC pad 22. The sense effective region 12a has a rectangular planar shape, for example. The unit cells of the current sensor 12 are arranged next to one another in directions parallel to the front surface of the semiconductor substrate 10. The directions in which the unit cells of the current sensor 12 are adjacent to one another are the same directions in which the unit cells of the main semiconductor device 11 are adjacent to one another, for example. The unit cells of the current sensor 12 are connected in parallel to one another via the OC pad 22.

Moreover, within the region of the semiconductor substrate 10 that is covered by the OC pad 22, a region that does not include the sense effective region 12a is a sense non-effective region 12b which does not function as the current sensor 12. None of the unit cells of the current sensor 12 are arranged in this sense non-effective region 12b. Across substantially the entire sense non-effective region 12b, a p-type base region 34b' (see FIG. 2) is formed in the surface region of the front surface of the semiconductor substrate 10. Although this is not explicitly illustrated in FIG. 1, the p-type base region 34b' is arranged separated from the sense effective region 12a and surrounds the periphery of the sense effective region 12a in a substantially rectangular shape.

The temperature sensor (not illustrated in the figure) has the function of detecting the temperature of the main semiconductor device 11 by utilizing the temperature characteristics of a diode. The temperature sensor is arranged directly beneath an anode pad and a cathode pad which are arranged separated from the gate pad 21b and the OC pad 22 in the main non-effective region 1b. The temperature sensor may be a polysilicon (poly-Si) layer formed on a field insulating film 80 (see FIG. 2) on the front surface of the semiconductor substrate 10 or may be a p-n junction between a p-type region and an n-type region formed within the semiconductor substrate 10, for example.

The overvoltage protection unit (not illustrated in the figure) is a diode which protects the main semiconductor device 11 from overvoltage (OV) resulting from surges or the like, for example. The current sensor 12, the temperature sensor, and the overvoltage protection unit are controlled by an arithmetic circuit. The main semiconductor device 11 is controlled on the basis of output signals from the current sensor 12, the temperature sensor, and the overvoltage protection unit. The arithmetic circuit is constituted by a plurality of semiconductor devices such as complementary MOS (CMOS) circuits.

The edge termination region 2 is a region between the active region 1 and the edge of the semiconductor substrate 10, surrounds the periphery of the active region 1, and maintains the breakdown voltage by reducing the electric field on the front surface side of the semiconductor substrate 10. In the edge termination region 2, a voltage withstand structure (not illustrated in the figure) such as a field-limiting ring (FLR) or a junction termination extension (JTE) structure is arranged, for example. Here, "breakdown voltage" refers to a limit voltage at which the device does not malfunction or suffer damage. The width (distance from the active region 1 to the edge of the semiconductor substrate 10) w1 of the edge termination region 2 may be approximately 40 μm, for example.

Moreover, in the edge termination region 2, the first and second gate runners 23 and 83, which are constituted by polysilicon (poly-Si) layers, are formed separated from one another but in the same layer on the front surface of the semiconductor substrate 10 with the field insulating film 80 interposed therebetween. The first gate runner 23 is a gate runner for the main semiconductor device 11. The first gate runner 23 extends along the boundary between the active region 1 and the edge termination region 2 and surrounds the periphery of the active region 1 in a substantially rectangular shape.

The first gate runner 23 is connected to a connecting portion constituted by a polysilicon layer (a polysilicon connecting portion) 23a and is electrically connected to the gate pad 21b via this polysilicon connecting portion 23a. The first gate runner 23 is connected to all of the gate electrodes (first gate electrodes) 39a (see FIG. 2) of the main semiconductor device 11. For example, the gate electrodes 39a extend from the main effective region 1a to the edge termination region 2, with the ends of these gate electrodes being connected to the first gate runner 23.

The polysilicon connecting portion 23a is arranged at the boundary between the active region 1 and the edge termination region 2. The polysilicon connecting portion 23a is arranged at a location at which the distance from the first gate runner 23 to the gate pad 21b is shortest, for example, and extends from the first gate runner 23 to the gate pad 21b in a substantially straight-line shape. The ends of the polysilicon connecting portion 23a are respectively connected to the first gate runner 23 and the gate pad 21b.

In an interlayer insulating film (not illustrated in the figure) which covers the first gate runner 23, a contact hole which exposes the first gate runner 23 is formed. A first gate metal layer (not illustrated in the figure) is connected to the first gate runner 23 via this contact hole. The first gate metal layer is arranged above the first gate runner 23 in the same planar shape as the first gate runner 23, for example. The first gate metal layer is made of the same material as the source pad 21a, for example.

The second gate runner 83 is a gate runner for the current sensor 12. The second gate runner 83 is arranged between the active region 1 and the first gate runner 23. The second gate runner 83 may preferably be arranged so as to surround the periphery of the active region 1. This makes it possible to extend the length of the second gate runner 83 to substantially the same length as the outer periphery of the active region 1. For example, the second gate runner 83 surrounds the periphery of the active region 1 in a substantially rectangular shape having an opening.

One end of the second gate runner 83 is electrically connected to all of the gate electrodes (second gate electrodes) 39b (see FIG. 2) of the current sensor 12 via a polysilicon connecting portion 23b. The other end of the second gate runner 83 is connected to the first gate runner 23 and is thus electrically connected to the gate pad 21b via the first gate runner 23. In other words, all of the gate electrodes 39b of the current sensor 12 are electrically connected to the gate pad 21b via the second gate runner 83 and the first gate runner 23.

More specifically, the second gate runner 83 is arranged along the boundary between the main effective region 1a and the edge termination region 2 and surrounds the periphery of the main effective region 1a in a substantially U-shaped shape. In addition, both ends of the substantially U-shaped portion of the second gate runner 83 that surrounds the periphery of the main effective region 1a extend from the main effective region 1a side along the boundary between the main non-effective region 1b and the edge termination region 2 and terminate near the boundary between the main non-effective region 1b and the edge termination region 2. Furthermore, one of the ends of the second gate runner 83 extends to and terminates near the OC pad 22 and is connected to the polysilicon connecting portion 23b.

The other end of the second gate runner 83 extends to and terminates near the gate pad 21b and is connected to the first gate runner 23. For example, the other end of the second gate runner 83 extends from near the polysilicon connecting portion 23a between the gate pad 21b and the first gate runner 23 along the outer periphery of the gate pad 21b and towards the center of the semiconductor substrate 10, and then extends along the outer periphery of the gate pad 21b towards the edge of the semiconductor substrate 10, passes through the space between the gate pad 21b and the OC pad 22, and is connected to the first gate runner 23.

Thus, the gate electrodes 39b of the current sensor 12 are electrically connected to the first gate runner 23 via the second gate runner 83. A transient voltage (instantaneous voltage or surge voltage) V which is produced as the current sensor 12 switches ON and OFF when a pulse-shaped gate voltage is applied is determined by the gate current di and the gate capacitance C of the current sensor 12, and letting the gate input charge (the total amount of charge that needs to be charged for the gate voltage to reach the gate threshold voltage) and the gate capacitance of the current sensor 12 respectively be Q and C, this voltage is given by $V=Q/C=(di \cdot dt)/C$.

Therefore, increasing the gate capacitance C of the current sensor 12 makes it possible to reduce the transient voltage V produced as the current sensor 12 switches ON and OFF when a pulse-shaped gate voltage is applied to the gate pad 21b, thereby making it possible to increase the ESD tolerance of the current sensor 12. The gate capacitance C of the current sensor 12 can be increased proportionally to the surface area of the second gate runner 83. Increases in the surface area of the second gate runner 83 can be achieved by increasing the length of the second gate runner 83. Therefore, the second gate runner 83 is preferably arranged in a layout that makes it possible to increase the length of the second gate runner 83 to the greatest extent possible.

An internal resistor (gate resistor) 81 or an internal coil (coil) 82 or both may be electrically connected to the second gate runner 83. The internal resistor 81 has the function of reducing the gate current di of the current sensor 12. The internal coil 82 has the function of reducing the gate current per unit time di/dt of the current sensor 12. Therefore, including the internal resistor 81 or the internal coil 82 or both makes it possible to further reduce the transient voltage V produced as the current sensor 12 switches ON and OFF when a pulse-shaped gate voltage is applied to the gate pad 21b.

The internal coil 82 creates a delay in the ON operation of the current sensor 12. Therefore, the trade-off between delaying the ON operation of the current sensor 12 and reducing the gate current per unit time di/dt of the current sensor 12 should be considered when setting the inductance of the internal coil 82. As long as the internal resistor 81 and the internal coil 82 are connected in series between the gate pad 21b and the gate electrodes 39b of the current sensor 12 via the second gate runner 83, the layout within the edge termination region 2 can be modified in various ways. The configuration of the internal resistor 81 and the internal coil 82 will be described later.

It is preferable that a distance w2 between the gate pad 21b and the OC pad 22 be as small as possible. None of the unit cells of the main semiconductor device 11 are arranged in the space between the gate pad 21b and the OC pad 22. This is because making the distance w2 between the gate pad 21b and the OC pad 22 small makes it possible to reduce the proportion of the surface area of the semiconductor substrate 10 that is occupied by the surface area of the main non-effective region 1b. Except for the region between the gate pad 21b and the OC pad 22, regions between adjacent electrode pads may have unit cells of the main semiconductor device 11 arranged therein and be part of the main effective region.

The polysilicon connecting portion 23b is arranged at the boundary between the active region 1 and the edge termination region 2. The polysilicon connecting portion 23b is arranged at a location at which the distance from the first gate runner 23 to the sense effective region 12a is shortest, for example. The polysilicon connecting portion 23b extends in a substantially straight-line shape from the first gate runner 23 side to the sense effective region 12a, with one end connected to the gate electrodes 39b of the current sensor 12 and the other end connected to the second gate runner 83.

The polysilicon connecting portion 23b is electrically connected to the first gate runner 23 via the second gate runner 83 as described above but is not directly connected to the first gate runner 23. In an interlayer insulating film 85 (see FIG. 3) which covers the second gate runner 83, a contact hole (not illustrated in the figure) which exposes the second gate runner 83 is formed. A second gate metal layer 84 (see FIG. 3) is connected to the second gate runner 83 via this contact hole.

The second gate metal layer 84 is arranged above the second gate runner 83 in the same planar shape as the second gate runner 83, for example. The second gate metal layer 84 is connected to the first gate metal layer at a connection location 23c of the first and second gate runners 23 and 83. The second gate metal layer 84 is made of the same material as the source pad 21a, for example. The second gate metal layer 84 is directly connected or electrically connected to the internal resistor 81 and the internal coil 82.

Figure 2:
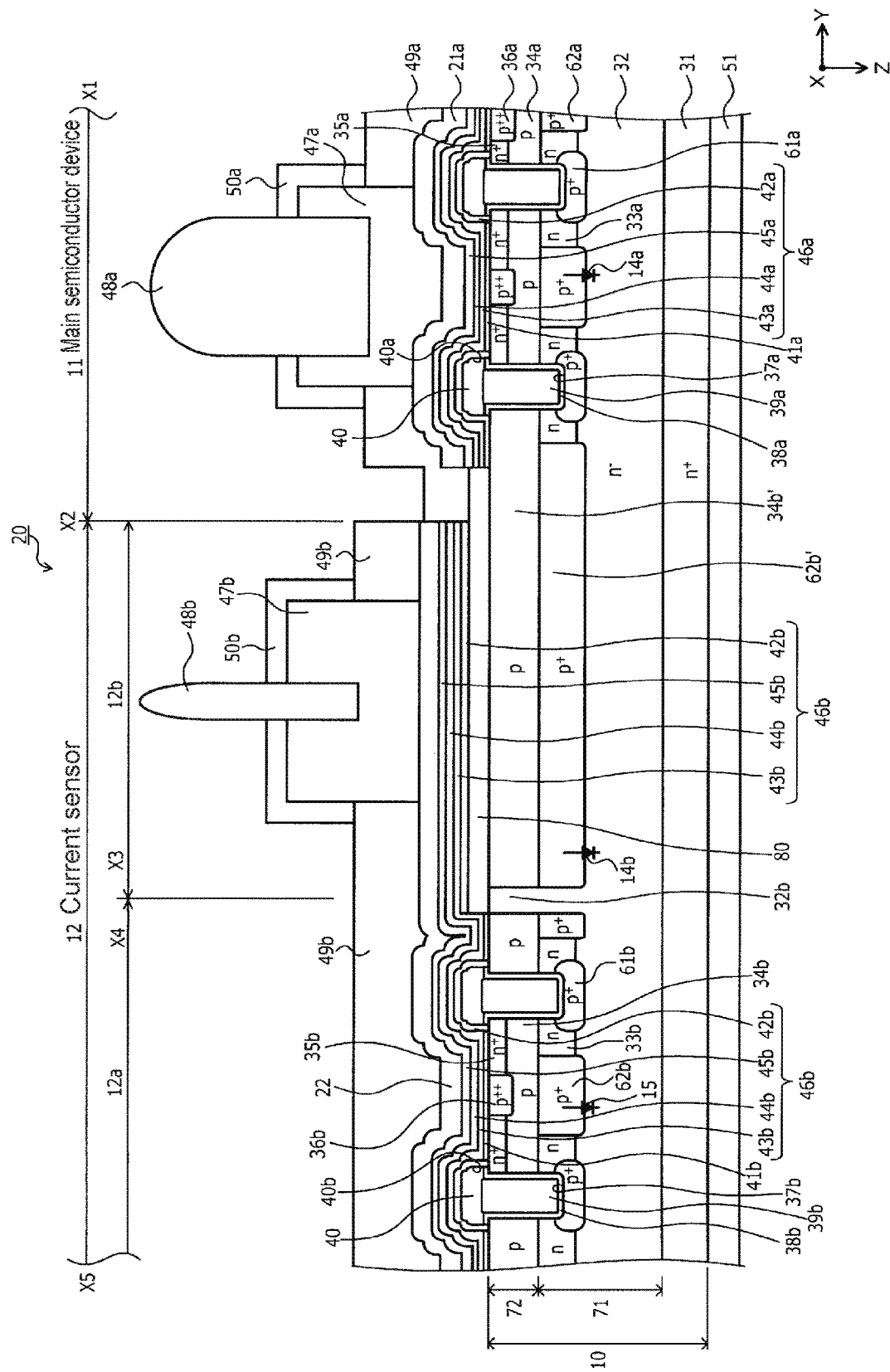
FIG. 2 is a cross-sectional view illustrating the cross-sectional structure of a portion of an active region in FIG. 1.

Next, the cross-sectional structure of the semiconductor device 20 according to Embodiment 1 will be described. FIG. 2 is a cross-sectional view illustrating the cross-sectional structure of a portion of the active region in FIG. 1. FIG. 2 shows the cross-sectional structure of the main effective region 1a and the current sensor 12 (the cross-sectional structure along cutline X1-X2-X3-X4-X5). Although FIG. 2 only shows a portion of the respective unit cells of the main effective region 1a and the sense effective region 12a, the unit cells of the main effective region 1a and the sense effective region 12a all have the same structure.

Figure 3:
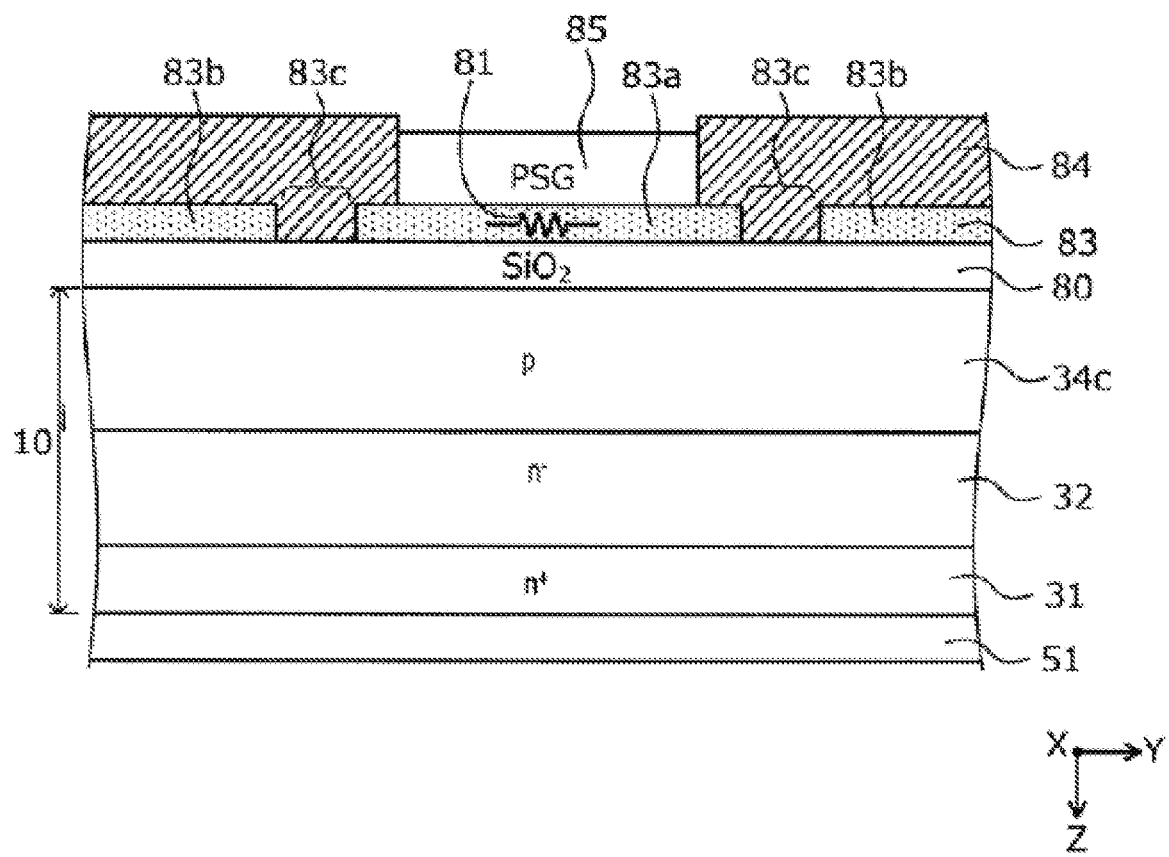
FIG. 3 is a cross-sectional view illustrating the cross-sectional structure of a portion of an edge termination region in FIG. 1.
Figure 4:
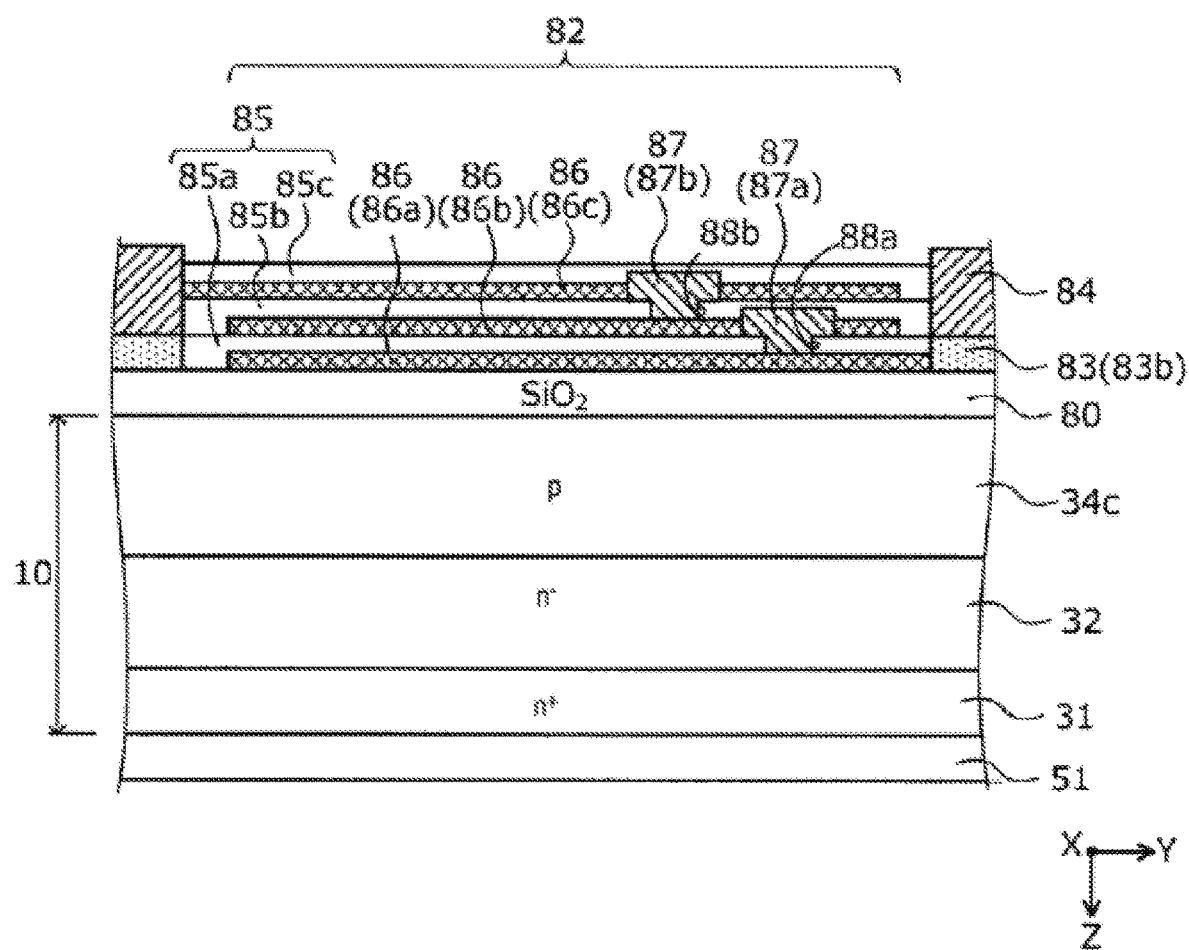
FIG. 4 is a cross-sectional view illustrating the cross-sectional structure of a portion of the edge termination region in FIG. 1.
Figure 5:
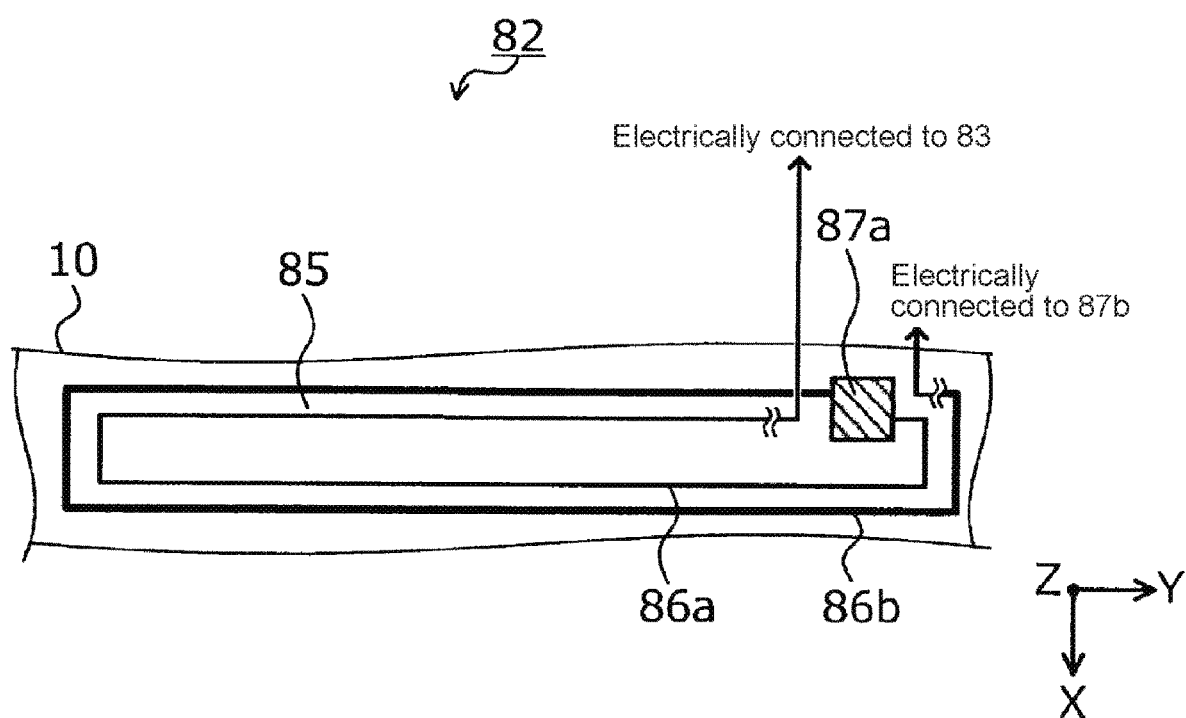
FIG. 5 is a plan view schematically illustrating the layout of a portion of the edge termination region in FIG. 1 as viewed from the front surface side of the semiconductor substrate.
Figure 6:
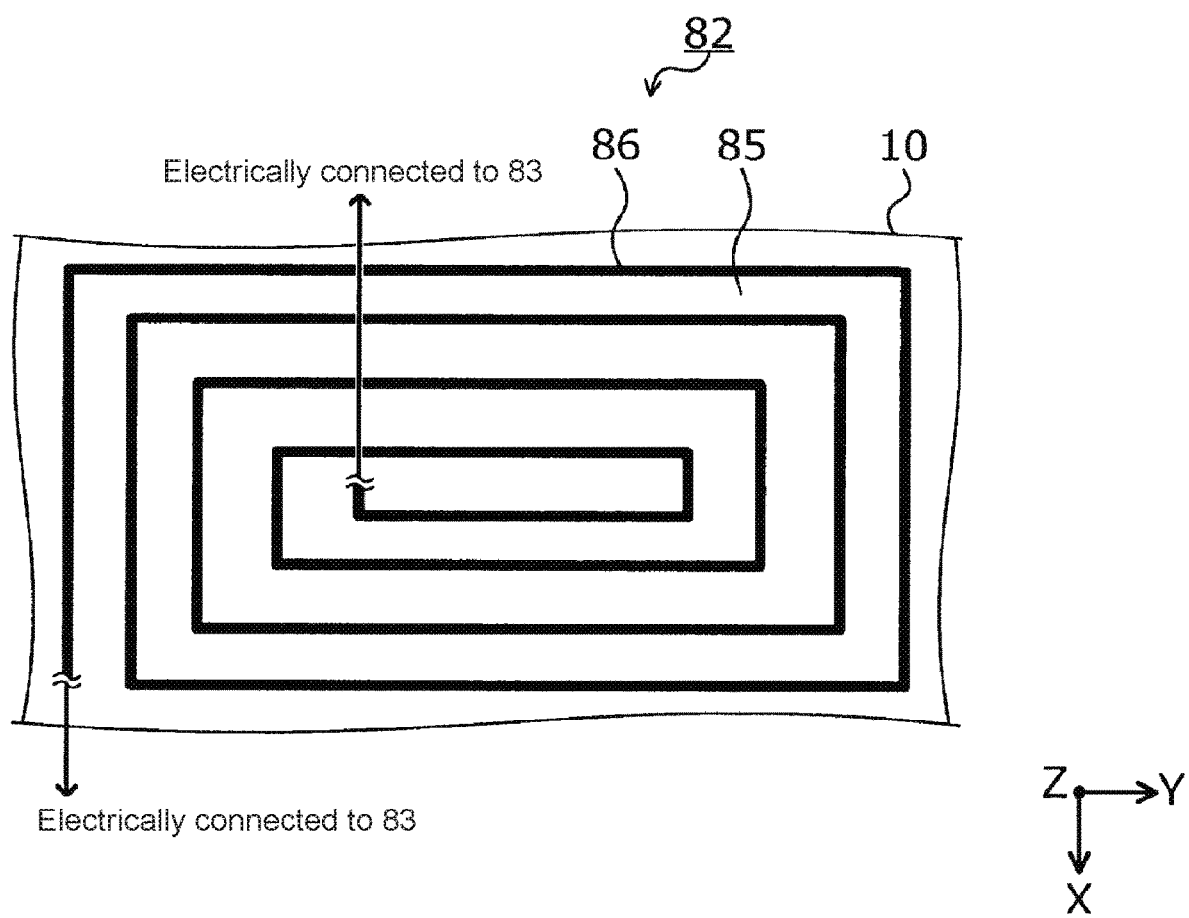
FIG. 6 is a plan view illustrating an example of the layout of a portion of the edge termination region in FIG. 1 as viewed from the front surface side of the semiconductor substrate.

FIGS. 3 and 4 are cross-sectional views illustrating the cross-sectional structures of portions of the edge termination region in FIG. 1. FIG. 5 is a plan view schematically illustrating the layout of a portion of the edge termination region in FIG. 1 as viewed from the front surface side of the semiconductor substrate. FIG. 6 is a plan view illustrating an example of the layout of a portion of the edge termination region in FIG. 1 as viewed from the front surface side of the semiconductor substrate. FIG. 3 illustrates an example of the cross-sectional structure of the internal resistor 81 in FIG. 1. FIG. 4 illustrates an example of the cross-sectional structure of the internal coil 82. FIG. 4 schematically illustrates the layout of the internal coil 82. FIG. 5 illustrates an example of the layout of the internal coil 82.

The main semiconductor device 11 is a vertical MOSFET which includes MOS gates (insulated gates constituted by three-layer metal-oxide-semiconductor structures) on the front surface side of the semiconductor substrate 10 in the main effective region 1a. Although here the main semiconductor device 11 and the circuits that protect and control the main semiconductor device 11 will be described as having similarly configured wiring structures that use pin-shaped wiring members (the terminal pins 48a and 48b described later) as an example, wiring structures that use wires may be included in place of these pin-shaped wiring members.

A semiconductor substrate 10 is an epitaxial substrate in which silicon carbide layers 71 and 72 which will respectively become an $n^-$ drift region 32 and a p-type base region 34a are epitaxially grown in order on the front surface of an $n^+$ starting substrate 31 made of silicon carbide. The main semiconductor device 11 has typical MOS gates with each including a p-type base region 34a, an $n^+$ source region 35a, a $p^{++}$ contact region 36a, a trench 37a, a gate insulating film 38a, and a gate electrode 39a which are formed in the front surface side of the semiconductor substrate 10.

More specifically, the trenches 37a go from the front surface of the semiconductor substrate 10 (the front surface of the p-type silicon carbide layer 72) through the p-type silicon carbide layer 72 in the depth direction Z and reach the $n^-$ silicon carbide layer 71. The trenches 37a may be arranged in a stripe pattern extending in a direction parallel to the front surface of the semiconductor substrate 10 or may be arranged in a matrix pattern when viewed from the front surface side of the semiconductor substrate 10, for example. FIG. 2 illustrates stripe-shaped trenches 37a which extend in a first direction X (see FIG. 1) in which the electrode pads 21b and 22 are arranged side by side. The reference character Y indicates a direction which is parallel to the front surface of the semiconductor chip and orthogonal to the first direction.

Within each trench 37a, the gate electrode 39a is formed with the gate insulating film 38a interposed thereabeneath. In the space (mesa region) between two trenches 37a that are adjacent to one another, the p-type base region 34a, the $n^+$ source region 35a, and the $p^{++}$ contact region 36a are respectively selectively formed in the surface region of the front surface of the semiconductor substrate 10. The $n^+$ source region 35a and the $p^{++}$ contact region 36a are formed between the p-type base region 34a and the front surface of the semiconductor substrate 10. The $n^+$ source region 35a is formed closer to the trench 37a side than the $p^{++}$ contact region 36a.

No $n^+$ source regions 35a are arranged near the edges of the main effective region 1a. As a result, near the edges of the main effective region 1a, the source electrode of the main semiconductor device 11 is only electrically connected to the p-type base region 34a. This makes it possible to prevent a parasitic npn transistor constituted by the $n^+$ source region 35a, the p-type base region 34a, and the $n^-$ drift region 32 (or an n-type current spreading region 33a described later) from operating at the edges of the main effective region 1a.

The edges of the main effective region 1a are the portions of the main effective region 1a that are further outwards than the outermost trenches 37a in a second direction Y and the portions of the main effective region 1a that are further outwards than the ends of the trenches 37a in the first direction X. The $p^{++}$ contact region 36a does not necessarily need to be formed. When the $p^{++}$ contact region 36a is not formed, the p-type base region 34a reaches to the front surface of the semiconductor substrate 10 at a location further away from the trench 37a than the $n^+$ source region 35a and is exposed on the front surface of the semiconductor substrate 10.

Inside the semiconductor substrate 10, the $n^-$ drift region 32 is formed at a position closer to an $n^+$ drain region (the $n^+$ starting substrate 31) than the p-type base region 34a and contacts the p-type base region 34a. Between the p-type base region 34a and the $n^-$ drift region 32, an n-type current spreading region 33a may be formed in contact with these regions. This n-type current spreading region 33a is a so-called current spreading layer (CSL) which reduces carrier spreading resistance.

Moreover, inside the semiconductor substrate 10, first and second $p^+$ regions 61a and 62a may be formed at positions closer to the $n^+$ drain region than the p-type base region 34a. The first $p^+$ region 61a is formed separated from the p-type base region 34a and faces the bottom surface of the trench 37a in the depth direction Z. The second $p^+$ region 62a is formed, separated from the first $p^+$ region 61a and the trench 37a, in the mesa region and contacts the p-type base region 34a. The first and second $p^+$ regions 61a and 62a have the function of reducing the electric field that is applied to the bottom surface of the trench 37a.

An interlayer insulating film 40 is formed over the entire front surface of the semiconductor substrate 10 and covers the gate electrodes 39a. All of the gate electrodes 39a of the main semiconductor device 11 are electrically connected to the gate pad 21b via the first gate runner 23 and the polysilicon connecting portion 23a (see FIG. 1) by portions that are not illustrated in FIG. 2. The first gate runner 23 is formed on the front surface of the semiconductor substrate 10 with the field insulating film 80 interposed therebetween in the edge termination region 2.

The $n^+$ source regions 35a and the $p^{++}$ contact regions 36a of the main semiconductor device 11 are exposed within first contact holes 40a which go through the interlayer insulating film 40 in the depth direction Z and reach the semiconductor substrate 10. Inside each first contact hole 40a, a nickel silicide (NiSi, $Ni_2Si$, or thermally stable $NiSi_2$; hereinafter, collectively referred to as "NiSi") film 41a is formed on the front surface of the semiconductor substrate 10.

The NiSi film 41a makes ohmic contact with the semiconductor substrate 10 inside the first contact hole 40a and is electrically connected to the $n^+$ source region 35a and the $p^{++}$ contact region 36a. When the $p^{++}$ contact region 36a is not formed, the p-type base region 34a is exposed inside the first contact hole 40a instead of the $p^{++}$ contact region 36a and is electrically connected to the NiSi film 41a.

In the main effective region 1a, a barrier metal 46a is formed over the entire front surface of the interlayer insulating film 40 and the NiSi film 41a. The barrier metal 46a has the function of preventing interaction between the metal films of the barrier metal 46a and between the regions that face and sandwich the barrier metal 46a. The barrier metal 46a may have a multilayer structure in which a first titanium nitride (TiN) film 42a, a first titanium (Ti) film 43a, a second TiN film 44a, and a second Ti film 45a are layered in order, for example.

The first TiN film 42a is only formed on the front surface of the interlayer insulating film 40 and covers the entire front surface of the interlayer insulating film 40. The first Ti film 43a is formed on the front surfaces of the first TiN film 42a and the NiSi film 41a. The second TiN film 44a is formed on the front surface of the first Ti film 43a. The second Ti film 45a is formed on the front surface of the second TiN film 44a. The barrier metal is not formed on the temperature sensor, for example.

The source pad 21a is filled into the first contact holes 40a and is formed on the entire front surface of the second Ti film 45a. The source pad 21a is electrically connected to the $n^+$ source region 35a and the p-type base region 34a via the barrier metal 46a and the NiSi film 41a and functions as the source electrode of the main semiconductor device 11. The source pad 21a is an aluminum (Al) film or an Al alloy film of approximately 5 μm in thickness, for example.

More specifically, when the source pad 21a is an Al alloy film, the source pad 21a may be an aluminum-silicon (Al—Si) film containing less than or equal to approximately 5% silicon total, may be an aluminum-silicon-copper (Al—Si—Cu) film containing less than or equal to approximately 5% silicon total and less than or equal to approximately 5% copper (Cu) total, or may be an aluminum-copper (Al—Cu) film containing less than or equal to approximately 5% copper total, for example.

One end of a terminal pin 48a is bonded onto the source pad 21a via a plating film 47a and a solder layer (not illustrated in the figure). The other end of the terminal pin 48a is bonded to a metal bar (not illustrated in the figure) arranged facing the front surface of the semiconductor substrate 10. Moreover, the other end of the terminal pin 48a is exposed to the outside of a case (not illustrated in the figure) in which the semiconductor substrate 10 is packaged and is electrically connected to an external device (not illustrated in the figure). The terminal pin 48a is a circular rod-shaped (cylinder-shaped) wiring member of a prescribed diameter.

The terminal pin 48a is solder-bonded to the plating film 47a so as to stand up substantially orthogonally to the front surface of the semiconductor substrate 10. The terminal pin 48a is an external connection terminal for extracting the voltage of the source pad 21a to the exterior and is connected to an external ground voltage (minimum voltage). The portions of the front surface of the source pad 21a other than the plating film 47a are covered by a first protective film 49a, and the boundary between the plating film 47a and the first protective film 49a is covered by a second protective film 50a. The first and second protective films 49a and 50a are polyimide films, for example.

A drain electrode 51 makes ohmic contact with the entire rear surface of the semiconductor substrate 10 (the rear surface of the n$^+$ starting substrate 31). A drain pad (electrode pad; not illustrated in the figure) having a multilayer structure in which a Ti film, a nickel (Ni) film, and a gold (Au) film are layered in order, for example, is formed on the drain electrode 51. The drain pad is solder-bonded to a metal base plate (not illustrated in the figure) and contacts at least one portion of a base section of cooling fins (not illustrated in the figure) via this metal base plate.

By bonding the terminal pin 48a to the front surface of the semiconductor substrate 10 and bonding the rear surface to the metal base plate as described above, the semiconductor device 20 according to Embodiment 1 has a dual-surface cooling structure which includes cooling structures on both surfaces of the semiconductor substrate 10. In other words, heat generated by the semiconductor substrate 10 is radiated from fin portions of the cooling fins that contact the rear surface of the semiconductor substrate 10 via the metal base plate and is also radiated from the metal bar bonded to the terminal pin 48a on the front surface of the semiconductor substrate 10.

The current sensor 12 includes a p-type base region 34b, n$^+$ source regions 35b, p$^{++}$ contact regions 36b, trenches 37b, gate insulating films 38b, gate electrodes 39b, and an interlayer insulating film 40 which have the same configuration as the respectively corresponding components of the main semiconductor device 11. The MOS gates of the current sensor 12 are formed in the sense effective region 12a of the main non-effective region 1b. Similar to the p-type base region 34a of the main semiconductor device 11, the p-type base region 34b of the current sensor 12 is constituted by the p-type silicon carbide layer 72.

Similar to in the main semiconductor device 11, in the current sensor 12 no n$^+$ source regions 35b are arranged near the edges of the sense effective region 12a. The edges of the sense effective region 12a are the portions of the sense effective region 12a that are further outwards than the outermost trenches 37b in the second direction Y and the portions of the sense effective region 12a that are further outwards than the ends of the trenches 37b in the first direction X. The p$^{++}$ contact regions 36b do not necessarily need to be formed.

Similar to the main semiconductor device 11, the current sensor 12 may include an n-type current spreading region 33b and first and second p$^+$ regions 61b and 62b. All of the gate electrodes 39b of the current sensor 12 are electrically connected to the gate pad 21b via the polysilicon connecting portion 23b and the second gate runner 83 (see FIG. 1) by portions that are not illustrated in FIG. 2. The gate electrodes 39b of the current sensor 12 are covered by the interlayer insulating film 40.

In the sense effective region 12a, second contact holes 40b are formed going through the interlayer insulating film 40 in the depth direction Z and reaching the semiconductor substrate 10. In the second contact holes 40b, the n$^+$ source regions 35b and the p$^{++}$ contact regions 36b of the current sensor 12 are exposed. Similar to in the main semiconductor device 11, inside each second contact hole 40b an NiSi film 41b which is electrically connected to the n$^+$ source region 35b and the p$^{++}$ contact region 36b is formed.

When the p$^{++}$ contact regions 36b are not formed, the p-type base region 34b is exposed inside the second contact holes 40b instead of the p$^{++}$ contact regions 36b and is electrically connected to the NiSi films 41b. Similar to in the main semiconductor device 11, a barrier metal 46b is formed over the entire front surface of the interlayer insulating film 40 and over the entire front surface of the NiSi films 41b in the sense effective region 12a. The reference characters 42b to 45b respectively correspond to a first TiN film, a first Ti film, a second TiN film, and a second Ti film which are part of the barrier metal 46b.

The OC pad 22 is formed over the entire front surface of the barrier metal 46b so as to fill in the second contact holes 40b. The OC pad 22 is electrically connected to the n$^+$ source regions 35b and the p-type base region 34b of the current sensor 12 via the barrier metal 46b and the NiSi films 41b. The OC pad 22 functions as the source electrode of the current sensor 12. The OC pad 22 is made of the same material as the source pad 21a, for example.

In the sense non-effective region 12b of the main non-effective region 1b, the p-type base region 34b' is formed in the surface region of the front surface of the semiconductor substrate 10 as described above. Similar to the p-type base region 34a of the main semiconductor device 11, the p-type base region 34b' is constituted by the p-type silicon carbide layer 72. The p-type base region 34b' is arranged between the p-type base region 34b of the current sensor 12 and the p-type base region 34a and a p-type region 34c for device isolation (described later; see FIGS. 3 and 4) of the main semiconductor device 11.

The p-type base region 34b' is isolated from the p-type base region 34b of the current sensor 12 by an n$^-$ region 32b in the surface region of the front surface of the semiconductor substrate 10. The p-type base region 34b' may be connected to the p-type base region 34a of the main semiconductor device 11. When the p-type base region 34b' is connected to the p-type base region 34a of the main semiconductor device 11, a parasitic diode 14 (14b) of the main semiconductor device 11 is formed by the p-n junction between the p-type base region 34b' and the n⁻ drift region 32.

The p-type base region 34b' is isolated from the p-type region 34c for device isolation by an n⁻ region (not illustrated in the figure) in the surface region of the front surface of the semiconductor substrate 10. Isolating the p-type base region 34b' from the p-type region 34c for device isolation makes it possible to inhibit concentration of hole current in the current sensor 12, where this hole current is produced in the n⁻ drift region 32 of the edge termination region 2 during turn-off of the parasitic diode 14b (described later) formed in the main non-effective region 1b of the active region 1 and flows from the rear surface side of the semiconductor substrate 10 to the main non-effective region 1b.

The p-type base region 34b' extends from directly beneath the OC pad 22 to across substantially the entire region of the main non-effective region 1b except for the sense effective region 12a. The p-type base region 34b', as a result of forming a p-n junction with the n⁻ drift region 32, maintains a prescribed breakdown voltage in the main non-effective region 1b when a negative voltage relative to the source electrode (source pad 21a) of the main semiconductor device 11 is applied to the drain electrode 51. Between the p-type base region 34b' and the n⁻ drift region 32, a second p⁺ region 62b' may be formed in contact with these regions 34b' and 32.

In the sense non-effective region 12b, the barrier metal 46b and the OC pad 22 extend, on top of the field insulating film 80 covering the front surface of the semiconductor substrate 10, from the sense effective region 12a. In the sense non-effective region 12b, a terminal pin 48b is bonded onto the OC pad 22 using a wiring structure that is the same as the wiring structure on the source pad 21a. The terminal pin 48b is a circular rod-shaped (cylinder-shaped) wiring member of a smaller diameter than the terminal pin 48a.

Figure 7:
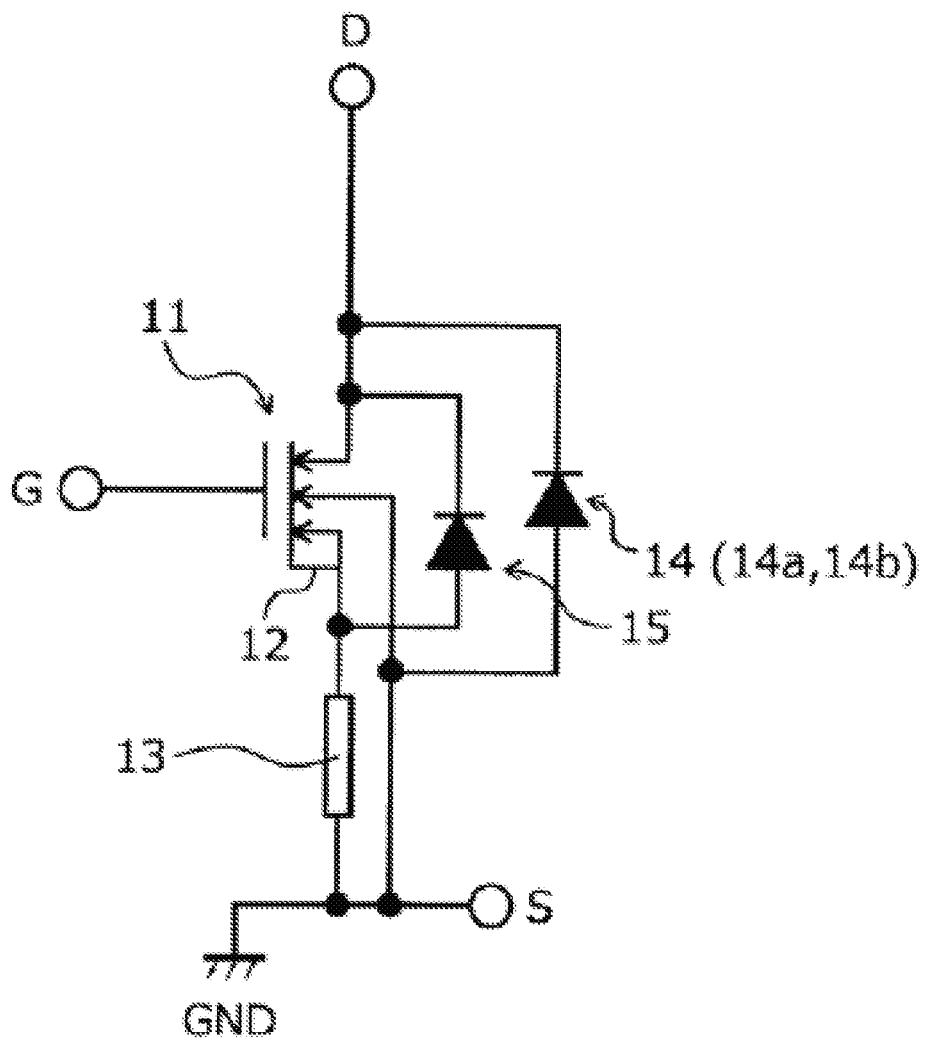
FIG. 7 is a circuit diagram illustrating an equivalent circuit of the semiconductor device according to Embodiment 1.

The terminal pin 48b is an external connection terminal for extracting the voltage of the OC pad 22 to the exterior, for example, and connects the OC pad 22 to the ground voltage via an external resistor 13 (see FIG. 7). Arranging the terminal pin 48b in the sense non-effective region 12b makes it possible to prevent stress that arises when bonding the terminal pin 48b from being applied to the unit cells of the current sensor 12. The reference characters 47b, 49b, and 50b respectively correspond to a plating film and first and second protective films which are part of the wiring structure on the OC pad 22.

Although this is not illustrated in the figure, the temperature sensor may be a polysilicon diode formed on the field insulating film 80 or may be a diffusion diode formed in the surface region of the front surface of the semiconductor substrate 10, for example, The electrode pads (anode pad and cathode pad) of the temperature sensor face a p-type anode region and an n-type cathode region of the temperature sensor in the depth direction Z with an interlayer insulating film interposed therebetween.

The electrode pads of the temperature sensor are respectively electrically connected to the p-type anode region and the n-type cathode region of the temperature sensor via contact holes in the interlayer insulating film. Although this is not illustrated in the figure, the gate pad 21b is formed on the field insulating film 80. A barrier metal having the same multilayer structure as the barrier metal 46a may be formed between the gate pad 21b and the field insulating film 80.

The material for the electrode pads of the temperature sensor and for the gate pad 21b is the same as for the source pad 21a, for example. Terminal pins are also bonded onto the electrode pads of the temperature sensor and onto the gate pad 21b using wiring structures (not illustrated in the figure) that are the same as the wiring structure on the source pad 21a, for example. Directly beneath the electrode pads of the temperature sensor and the gate pad 21b, the p-type base region 34b' extends across the surface region of the front surface of the semiconductor substrate 10 similarly to in the sense non-effective region 12b.

The p-type region 34c, which is substantially rectangular and surrounds the periphery of the active region 1, is formed in the surface region of the front surface of the semiconductor substrate 10 in the edge termination region 2. The p-type region 34c is isolated from the p-type base regions 34a, 34b, and 34b' in the active region 1 by an n⁻ region (not illustrated in the figure) in the surface region of the front surface of the semiconductor substrate 10. The p-type region 34c is a floating p-type region which, as a result of forming a p-n junction with the n⁻ drift region 32, forms a parasitic diode that electrically isolates the active region 1 and the edge termination region 2.

The first gate runner 23 (see FIG. 1) is a polysilicon layer formed on the front surface of the semiconductor substrate 10 with the field insulating film 80 interposed therebetween in the edge termination region 2. The second gate runner 83 is formed on the front surface of the semiconductor substrate 10 with the field insulating film 80 interposed therebetween in the edge termination region 2 (FIG. 3). In the second gate runner 83, a straight line-shaped portion (hereinafter, "first portion") 83a which runs along the boundary between the active region 1 and the edge termination region 2 is divided from other portions (hereinafter, "second portions") 83b.

This straight line-shaped first portion 83a of the second gate runner 83 forms the internal resistor 81. The ends of the first portion 83a of the second gate runner 83 are respectively electrically connected, via the second gate metal layer 84, to adjacent portions of the second portions 83b of the second gate runner 83 on the other sides of gaps 83c between the first and second portions 83a and 83b which are formed when the first portion 83a is divided from the second gate runner 83. In this way, the first portion 83a (the internal resistor 81) of the second gate runner 83 is connected in series to the second portions 83b of the second gate runner 83.

The first portion 83a of the second gate runner 83 may be designed to have higher resistance than the second portions 83b of the second gate runner 83. The first and second gate runners 23 and 83 are covered by the interlayer insulating film 85. A contact hole which exposes the first gate runner 23 in substantially the same planar shape as the first gate runner 23, for example, is formed in the interlayer insulating film 85. The first gate metal layer (not illustrated in the figure) contacts and is electrically connected to the first gate runner 23 via this contact hole.

A contact hole which exposes the second portions 83b of the second gate runner 83 in substantially the same planar shape as the second portions 83b of the second gate runner 83 is formed. The second gate metal layer 84 contacts and is electrically connected to the second portions 83b of the second gate runner 83 via this contact hole. Moreover, the second gate metal layer 84 extends from above the second portions 83b of the second gate runner 83 to above the first portion 83a and contacts and is electrically connected to the ends of the first portion 83a of the second gate runner 83.

In this way, the second gate metal layer 84 extends onto the ends of the first portion 83a of the second gate runner 83 so as to fill in the gaps 83c between the first and second portions 83a and 83b of the second gate runner 83. Therefore, the portions of the second gate metal layer 84 that cover both ends of the first portion 83a of the second gate runner 83 do not respectively extend onto the center of the first portion 83a of the second gate runner 83. The center of the first portion 83a of the second gate runner 83 is covered by the interlayer insulating film 85.

The internal coil 82 is constituted by a metal film 86 such as a titanium nitride (TiN) film which is formed on the front surface of the semiconductor substrate 10 with the field insulating film 80 interposed therebetween in the edge termination region 2. The internal coil 82 is connected in series to the second portions 83b of the second gate runner 83. The internal coil 82 constituted by the metal film 86 is connected in series to the second portions 83b of the second gate runner 83 by arranging the metal film 86 in place of portions of the second portions 83b of the second gate runner 83, for example.

As long as the metal film 86 is arranged in a spiral shape or a helical shape (FIG. 6), the internal coil 82 may have a single-layer structure (not illustrated in the figure) constituted by a single-layer metal film 86 or may have a multi-layer structure in which a plurality of metal films 86 (in FIGS. 4 and 5, three layers of metal films 86a to 86c) are layered together. When the internal coil 82 has a single-layer structure, for example, a single metal film 86 which extends in a spiral shape within a same plane parallel to the front surface of the semiconductor substrate 10 is arranged within the interlayer insulating film 85.

When the internal coil 82 has a multilayer structure, for example, a plurality of metal films 86 (86a, 86b, and 86c) each having a substantially rectangular planar shape with an opening are layered together sandwiching portions 85a and 85b of the interlayer insulating film 85 within the interlayer insulating film 85. This makes it possible to extend the length of the metal film 86 in a helical shape in the depth direction Z and also makes it possible to reduce the surface area of the internal coil 82 in comparison to when the metal film 86 has a single-layer structure.

More specifically, when the internal coil 82 has a multi-layer structure including three layers of metal films 86a to 86c that are layered together in order, one end of the metal film 86a in the lowermost layer is directly connected or electrically connected to a second portion 83b of the second gate runner 83. The other end of the metal film 86a and one end of the metal film 86b which face one another in the depth direction Z with a portion 85a of the interlayer insulating film 85 interposed therebetween are electrically connected via a metal film 87a such as a titanium nitride film or an aluminum (Al) film, for example, such that the metal films 86a and 86b form a continuous helix shape.

Similar to how the metal films 86a and 86b are connected, the other end of the metal film 86b and one end of the metal film 86c which face one another in the depth direction Z with a portion 85b of the interlayer insulating film 85 interposed therebetween are electrically connected via a metal film 87b such as a titanium nitride film or an aluminum film, for example, such that the metal films 86a to 86c form a continuous helix shape. The other end of the metal film 86c in the uppermost layer is electrically connected to a second portion 83b of the second gate 83 via the second gate metal layer 84.

Next, the operation of the semiconductor device 20 according to Embodiment 1 will be described using a case in which the p-type base region 34b' of the main non-effective region 1b is fixed to the source voltage of the main semiconductor device 11 as an example. FIG. 7 is a circuit diagram illustrating an equivalent circuit of the semiconductor device according to Embodiment 1. As illustrated in FIG. 7, the current sensor 12 is connected in parallel to the plurality of MOSFET unit cells of the main semiconductor device 11. The ratio of a sense current that flows through the current sensor 12 to a main current that flows through the main semiconductor device 11 (hereinafter, "current sense ratio") is set in advance.

The current sense ratio can be set by changing the numbers of unit cells in the main semiconductor device 11 and the current sensor 12 or the like, for example. The sense current flowing through the current sensor 12 is smaller than the main current flowing through the main semiconductor device 11 by an amount corresponding to the current sense ratio. The source of the main semiconductor device 11 is connected to a grounding point GND which has a ground voltage. A resistor 13 which is an external component is connected between the source and the grounding point GND of the current sensor 12.

When a voltage of greater than or equal to the threshold voltage is applied from the gate pad 21b to the gate electrodes 39a of the main semiconductor device 11 via the first gate runner 23 while a positive voltage relative to the source electrode (source pad 21a) of the main semiconductor device 11 is applied to the drain electrode 51, an n-type inversion layer (channel) is formed in the portion of the p-type base region 34a of the main semiconductor device 11 that is sandwiched between the n$^+$ source region 35a and the n-type current spreading region 33a. As a result, the main current flows from the drain to the source of the main semiconductor device 11, and the main semiconductor device 11 switches ON.

At this time, under the same conditions as in the main semiconductor device 11, a voltage of greater than or equal to the threshold voltage is also applied from the gate pad 21b to the gate electrodes 39b of the current sensor 12 via the first and second gate runners 23 and 83 while a positive voltage relative to the source electrode (OC pad 22) of the current sensor 12 is applied to the drain electrode 51. As a result, an n-type inversion layer is formed in the portion of the p-type base region 34b in the sense effective region 12a that is sandwiched between the n$^+$ source region 35b and the n-type current spreading region 33b. Thus, the sense current flows from the drain to the source of the current sensor 12, and the current sensor 12 switches ON.

The sense current passes through the resistor 13 that is connected to the source of the current sensor 12 and then flows to the grounding point GND. As a result, a voltage drop develops across the resistor 13. When an overcurrent is applied to the main semiconductor device 11, the sense current in the current sensor 12 increases in accordance with the magnitude of the overcurrent in the main semiconductor device 11, and the voltage drop across the resistor 13 also increases. Monitoring the magnitude of this voltage drop across the resistor 13 makes it possible to detect overcurrent in the main semiconductor device 11.

Meanwhile, when a voltage of less than the threshold voltage is applied from the gate pad 21b to the gate electrodes 39a of the main semiconductor device 11 via the first gate runner 23, the p-n junctions between the first and second p$^+$ regions 61a and 62a, the n-type current spreading region 33a, and the n$^-$ drift region 32 of the main semiconductor device 11 become reverse-biased. A voltage of less than the threshold voltage is also applied from the gate pad 21b to the gate electrodes 39b of the current sensor 12 via the first and second gate runners 23 and 83, and the p-n junctions between the first and second p$^+$ regions 61b and 62b, the n-type current spreading region 33b, and the n$^-$ drift region 32 of the current sensor 12 also become reverse-biased. As a result, the main current of the main semiconductor device 11 and the sense current of the current sensor 12 are blocked, and the main semiconductor device 11 and the current sensor 12 remain in the OFF state.

While the main semiconductor device 11 is OFF, when a negative voltage relative to the source electrode of the main semiconductor device 11 is applied to the drain electrode 51, a parasitic diode 14a formed by the p-n junctions between the p-type base region 34a, the first and second p$^+$ regions 61a and 62a, the n-type current spreading region 33a, and the n$^-$ drift region 32 in the main effective region 1a of the active region 1 conducts current. Furthermore, the parasitic diode 14b formed by the p-n junctions between the p-type base region 34b', the second p$^+$ region 62b', and the n$^-$ drift region 32 in the main non-effective region 1b of the active region 1 (or when the second p$^+$ region 62b' is not formed, by the p-n junction between the p-type base region 34b' and the n$^-$ drift region 32) conducts current.

These parasitic diodes 14a and 14b are the parasitic diode 14 of the main semiconductor device 11. While the parasitic diode 14 of the main semiconductor device 11 is conducting current, a parasitic diode formed by the p-n junction between the p-type region 34c for device isolation and the n$^-$ drift region 32 in the edge termination region 2 also conducts current. Moreover, while the current sensor 12 is OFF, a negative voltage relative to the source electrode of the current sensor 12 is applied to the drain electrode 51, and a parasitic diode 15 formed by the p-n junctions between the p-type base region 34b, the first and second p$^+$ regions 61b and 62b, the n-type current spreading region 33b, and the n$^-$ drift region 32 in the sense effective region 12a in the main non-effective region 1b of the active region 1 conducts current.

In this way, while the semiconductor device 20 according to Embodiment 1 is operating, the current sensor 12 switches ON and OFF as a pulse-shaped gate voltage is applied to the gate pad 21b. As described above, the transient voltage (instantaneous voltage or surge voltage) V produced as the current sensor 12 switches ON and OFF is determined by the gate current di and the gate capacitance C of the current sensor 12. In Embodiment 1, forming the second gate runner 83 for the current sensor 12 as described above makes it possible to increase the gate capacitance C exhibited by the current sensor 12 when a gate voltage is applied to the gate pad 21b by an amount proportional to the increase in the length of the second gate runner 83, thereby making it possible to increase the ESD tolerance of the current sensor 12.

Figure 8:
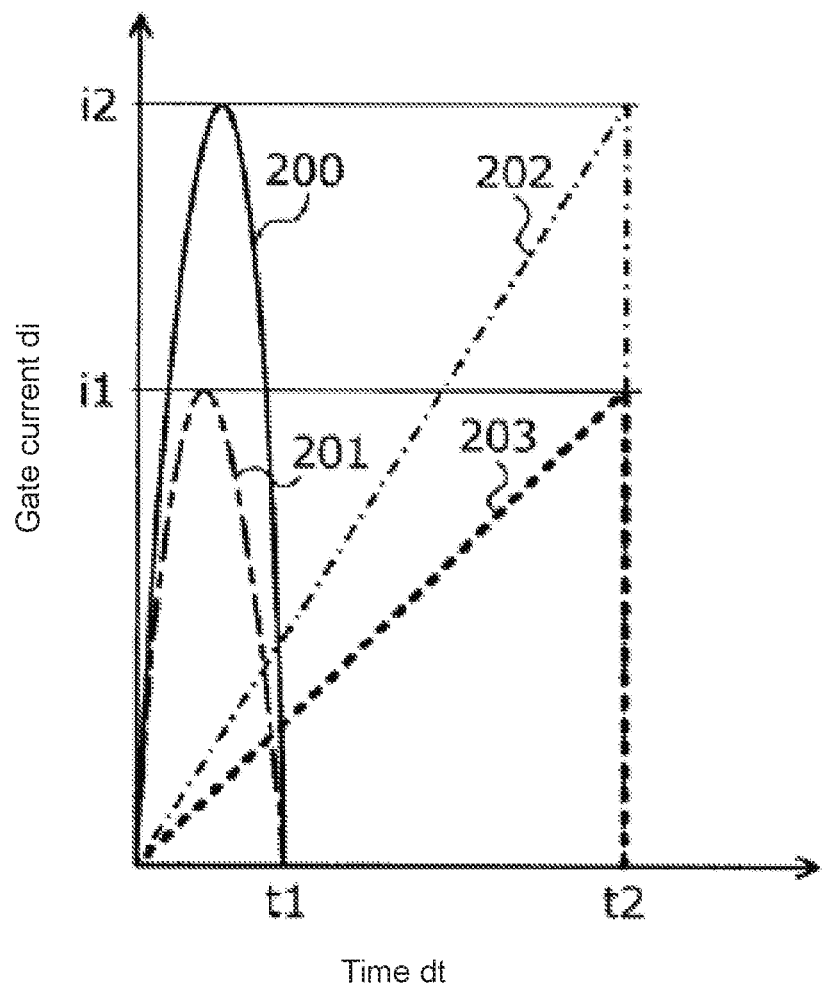
FIG. 8 is a property diagram illustrating electrical properties of a current sensor of the semiconductor device according to Embodiment 1.

Moreover, the internal resistor 81 and the internal coil 82 that are connected in series to the second gate runner 83 as described above make it possible to further increase the ESD tolerance of the current sensor 12. FIG. 8 is a property diagram illustrating electrical properties of the current sensor of the semiconductor device according to Embodiment 1. FIG. 8 shows a current waveform 200 of the gate current di of a current sensor 12 that does not include an internal resistor 81 or an internal coil 82 (hereinafter, Working Example 1) as well as current waveforms 201 to 203 of the gate currents di of current sensors 12 that do include an internal resistor 81 or an internal coil 82 or both (hereinafter, Working Examples 2-1 to 2-3).

As illustrated in FIG. 8, the maximum current i1 of the current waveform 201 of the gate current di of the current sensor 12 of Working Example 2-1, in which an internal resistor 81 is connected in series to the second gate runner 83, can be made smaller than the maximum current i2 of the current waveform 200 of the gate current di of the current sensor 12 of Working Example 1. The gate current per unit time di/dt of the current waveform 202 of the gate current di of the current sensor 12 of Working Example 2-2, in which an internal coil 82 is connected in series to the second gate runner 83, can be made smaller than the gate current per unit time di/dt of the current waveform 200 of the gate current di of the current sensor 12 of Working Example 1.

In the current sensor 12 of Working Example 2-3, in which both an internal resistor 81 and an internal coil 82 are connected in series to the second gate runner 83, both the maximum current i1 of the current waveform 203 of the gate current di and the gate current per unit time di/dt of the current waveform 203 of the gate current di can be made smaller than in the current sensor 12 of Working Example 1. In other words, the current sensor 12 of Working Example 2-3 makes it possible to achieve both the advantageous effect of the current sensor 12 of Working Example 2-1 and the advantageous effect of the current sensor 12 of Working Example 2-2.

Next, a method of manufacturing the semiconductor device 20 according to Embodiment 1 will be described. FIGS. 9 to 14 are cross-sectional views illustrating states during manufacture of the semiconductor device according to Embodiment 1. Although FIGS. 9 to 14 only illustrate the main semiconductor device 11, the components for all of the devices to be produced (manufactured) on the same semiconductor substrate 10 as the main semiconductor device 11 are formed at the same time as the components of the main semiconductor device 11, for example. The formation of the components of the current sensor 12, the temperature sensor, and the gate pad will be described with reference to FIGS. 1 to 6.

Figure 9:
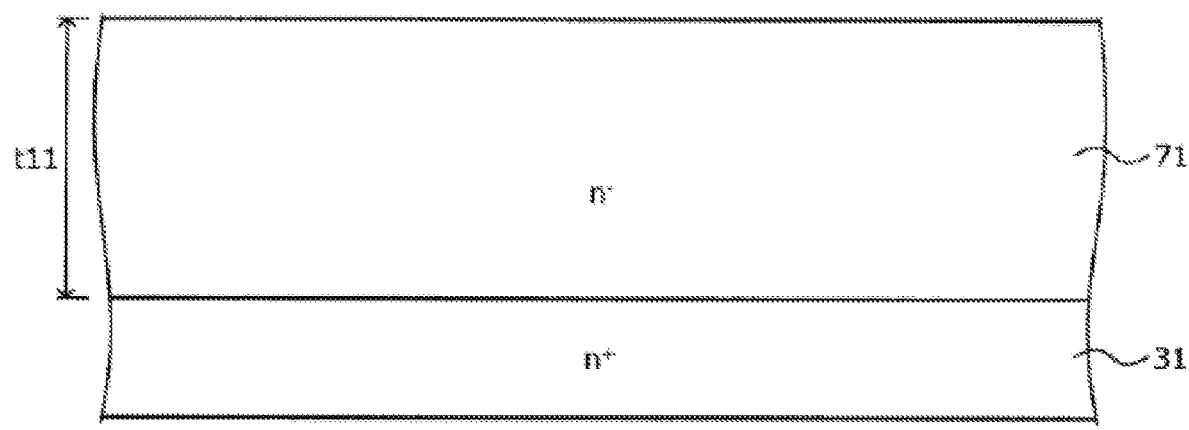
FIG. 9 is a cross-sectional view illustrating a state during manufacture of the semiconductor device according to Embodiment 1.

First, as illustrated in FIG. 9, an n$^+$ starting substrate (semiconductor wafer) 31 made of silicon carbide is prepared. The n$^+$ starting substrate 31 may be a monocrystalline silicon carbide substrate doped with nitrogen (N), for example. Next, an n$^-$ silicon carbide layer 71 doped with nitrogen to a lower concentration than the n$^+$ starting substrate 31 is epitaxially grown on the front surface of the n$^+$ starting substrate 31. When the main semiconductor device 11 is to be in the 3300V breakdown voltage class, the thickness t11 of the n$^-$ silicon carbide layer 71 may be approximately 30 µm, for example.

Figure 10:
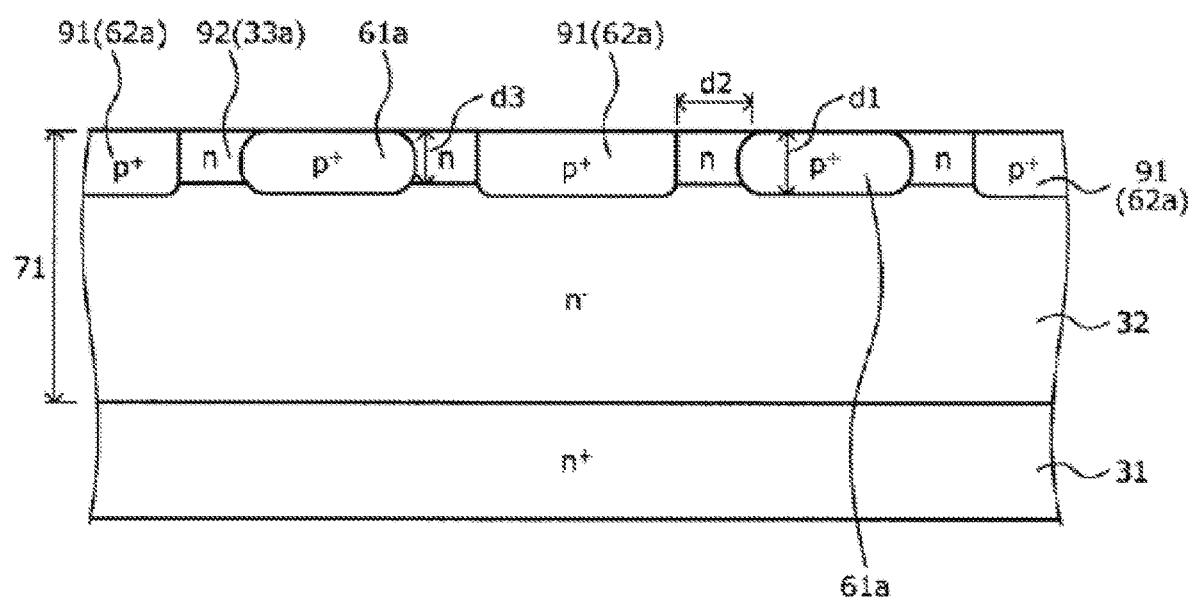
FIG. 10 is a cross-sectional view illustrating a state during manufacture of the semiconductor device according to Embodiment 1.

Next, as illustrated in FIG. 10, using photolithography and ion implantation of p-type impurities such as Al, for example, first p$^+$ regions 61a and p$^+$ regions 91 are respectively selectively formed in the surface region of the n$^-$ silicon carbide layer 71 in a main effective region 1a. The p$^+$ regions 91 are part of second p$^+$ regions 62a. The first p$^+$ regions 61a and the p$^+$ regions 91 are arranged alternately repeating in the second direction Y in FIG. 1, for example.

A distance d2 between each first p$^+$ region 61a and p$^+$ region 91 that are adjacent to one another may be approximately 1.5 µm, for example. The depth d1 and impurity concentration for both the first p$^+$ regions 61a and the p$^+$ regions 91 may respectively be approximately 0.5 µm and approximately 5.0×10$^{18}$/cm$^3$, for example. Then, the ion implantation mask (not illustrated in the figure) used to form the first p$^+$ regions 61a and the p$^+$ regions 91 is removed.

Next, using photolithography and ion implantation of n-type impurities such as nitrogen, for example, an n-type region 92 is formed, spanning across the entire main effective region 1a, in the surface region of the n$^-$ silicon carbide layer 71. The n-type region 92 is formed between the first p$^+$ regions 61a and the p$^+$ regions 91 and in contact these regions, for example. The depth d3 and impurity concentration of the n-type region 92 may respectively be approximately 0.4 μm and approximately $1.0 \times 10^{17}/\text{cm}^3$, for example.

This n-type region 92 is part of an n-type current spreading region 33a. The portion of the n⁻ silicon carbide layer 71 that is sandwiched between the n⁺ starting substrate 31 and the n-type region 92, first p⁺ regions 61a, and p⁺ regions 91 becomes an n⁻ drift region 32. Then, the ion implantation mask (not illustrated in the figure) used to form the n-type region 92 is removed. The order in which the n-type region 92 and the first p⁺ regions 61a and p⁺ regions 91 are formed may be reversed.

Figure 11:
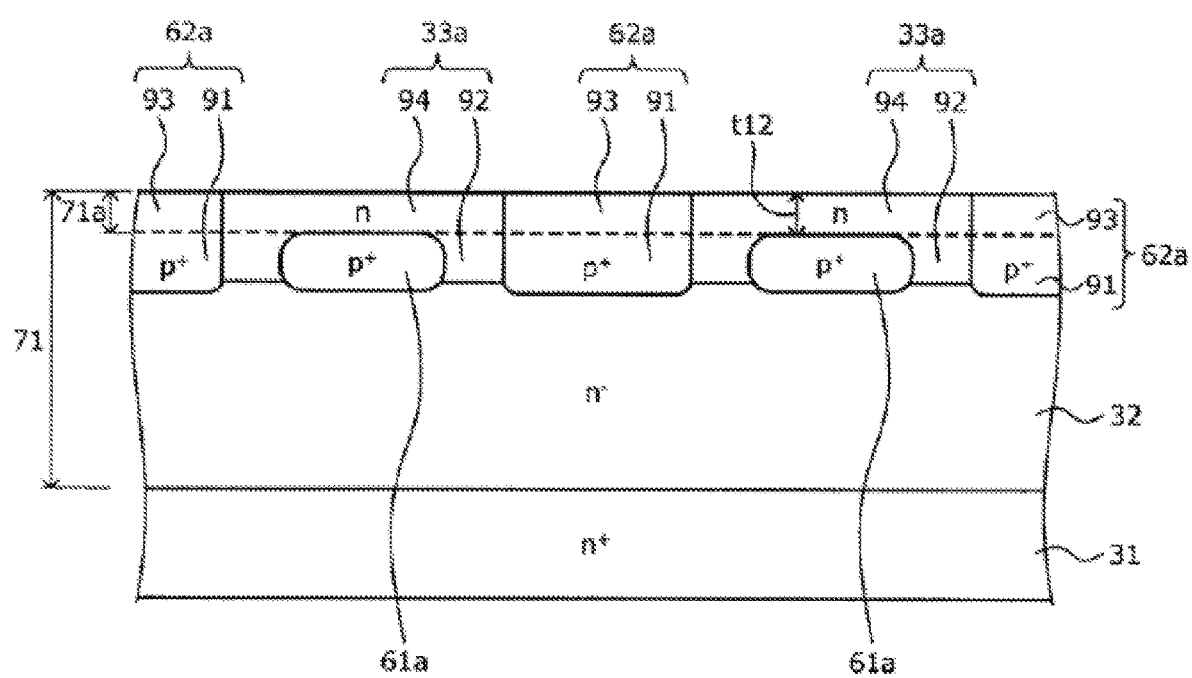
FIG. 11 is a cross-sectional view illustrating a state during manufacture of the semiconductor device according to Embodiment 1.

Next, as illustrated in FIG. 11, another n⁻ silicon carbide layer doped with n-type impurities such as nitrogen, for example, is epitaxially grown to a thickness t12 of 0.5 μm, for example, on the n⁻ silicon carbide layer 71 in order to increase the thickness of the n⁻ silicon carbide layer 71.

Next, using photolithography and ion implantation of p-type impurities such as Al, p⁺ regions 93 having a depth that reaches the p⁺ regions 91 are selectively formed in a portion 71a of the n⁻ silicon carbide layer 71 where the thickness was increased. The p⁺ regions 91 and 93 that are adjacent to one another in the depth direction Z are connected together to form second p⁺ regions 62a. The width and impurity concentration of the p⁺ regions 93 are substantially equal to those of the p⁺ regions 91, for example. Then, the ion implantation mask (not illustrated in the figure) used to form the p⁺ regions 93 is removed.

Next, using photolithography and ion implantation of n-type impurities such as nitrogen, for example, an n-type region 94 having a depth that reaches the n-type region 92 is selectively formed in the portion 71a of the n⁻ silicon carbide layer 71 where the thickness was increased. The impurity concentration of the n-type region 94 is substantially equal to that of the n-type region 92, for example. The n-type regions 92 and 94 that are adjacent to one another in the depth direction Z are connected together to form the n-type current spreading region 33a. The order in which the p⁺ regions 93 and the n-type region 94 are formed may be reversed. Then, the ion implantation mask (not illustrated in the figure) used to form the n-type region 94 is removed.

Figure 12:
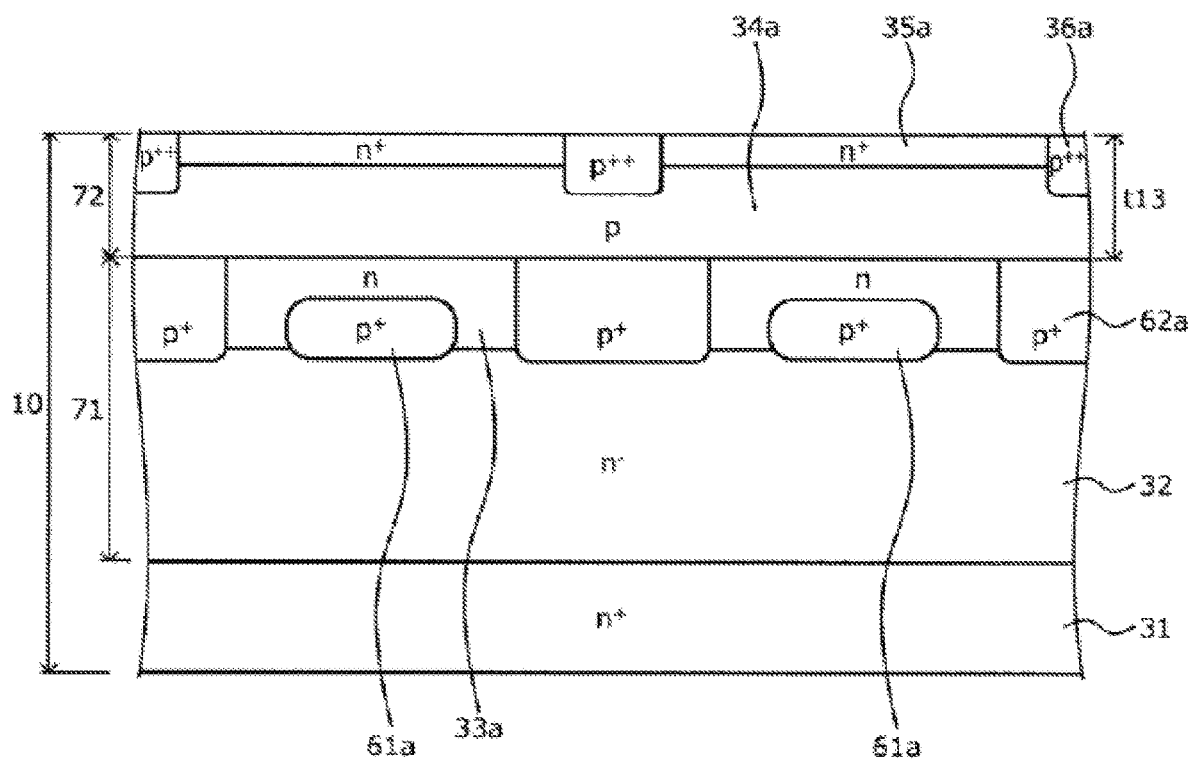
FIG. 12 is a cross-sectional view illustrating a state during manufacture of the semiconductor device according to Embodiment 1.

Next, as illustrated in FIG. 12, a p-type silicon carbide layer 72 doped with p-type impurities such as Al, for example, is epitaxially grown on the n⁻ silicon carbide layer 71. The thickness t13 and impurity concentration of the p-type silicon carbide layer 72 may respectively be approximately 1.3 μm and approximately $4.0 \times 10^{17}/\text{cm}^3$, for example. In this way, a semiconductor substrate (semiconductor wafer) 10 in which the n⁻ silicon carbide layer 71 and the p-type silicon carbide layer 72 are epitaxially grown and layered in order on the n⁺ starting substrate 31 is formed.

Next, a process including photolithography, ion implantation, and removal of the ion implantation mask as a set is repeated under different conditions to respectively selectively form n⁺ source regions 35a and p⁺⁺ contact regions 36a (see FIG. 2) in the p-type silicon carbide layer 72 in the main effective region 1a.

The order in which the n⁺ source regions 35a and the p⁺⁺ contact regions 36a are formed may be reversed. In the main effective region 1a, the portion sandwiched between the n⁻ silicon carbide layer 71 and the n⁺ source regions 35a and p⁺⁺ contact regions 36a becomes a p-type base region 34a. In each of the ion implantation processes described above, a resist film or an oxide film may be used as the ion implantation mask, for example.

Next, a heat treatment (activation annealing) is performed for approximately 2 minutes at a temperature of approximately 1700° C., for example, to activate the impurities in the diffusion regions formed using ion implantation (the first and second p⁺ regions 61a and 62a, the n-type current spreading region 33a, the n⁺ source regions 35a, and the p⁺⁺ contact regions 36a). The activation annealing may be performed a single time all at once after all of the diffusion regions have been formed or may be performed each time a diffusion region is formed using ion implantation.

Figure 13:
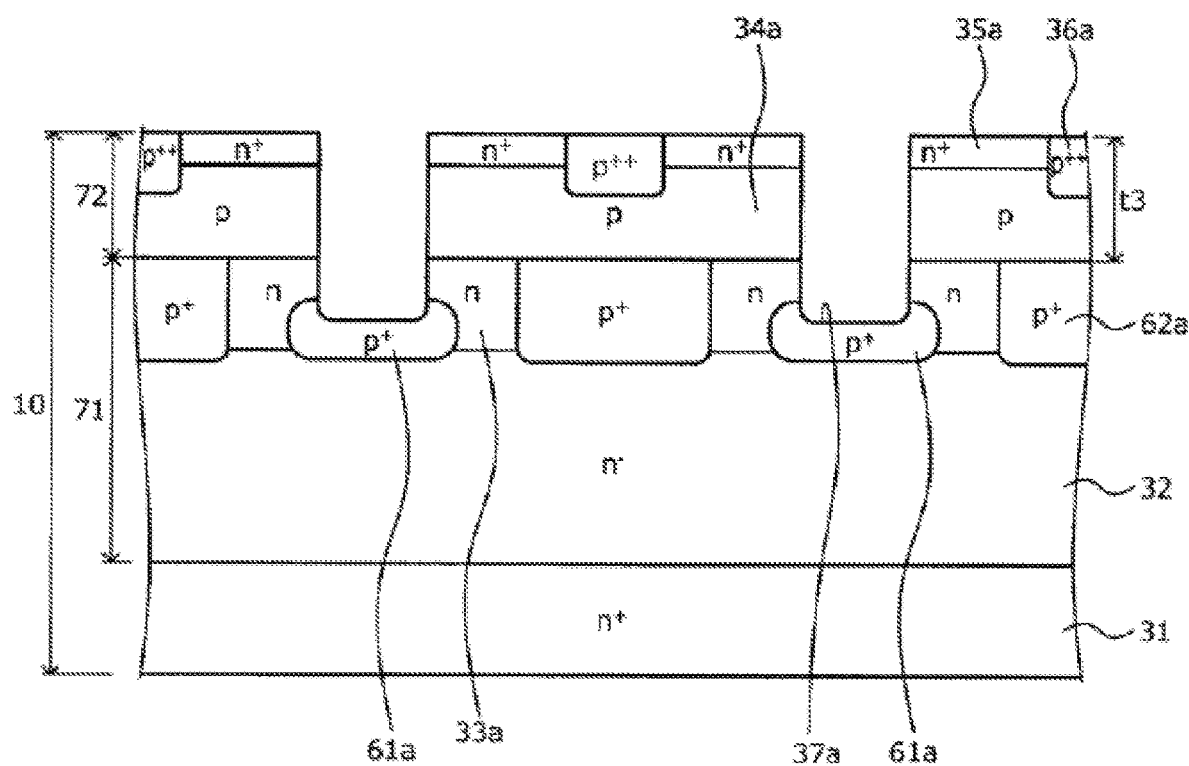
FIG. 13 is a cross-sectional view illustrating a state during manufacture of the semiconductor device according to Embodiment 1.

Next, as illustrated in FIG. 13, using photolithography and dry etching, for example, trenches 37a are formed going through the n⁺ source regions 35a and the p-type base region 34a. The trenches 37a have a depth that reaches the first p⁺ regions 61a in the n-type current spreading region 33a, for example. A resist film or an oxide film may be used as an etching mask for forming the trenches 37a, for example. Then, the etching mask is removed.

Figure 14:
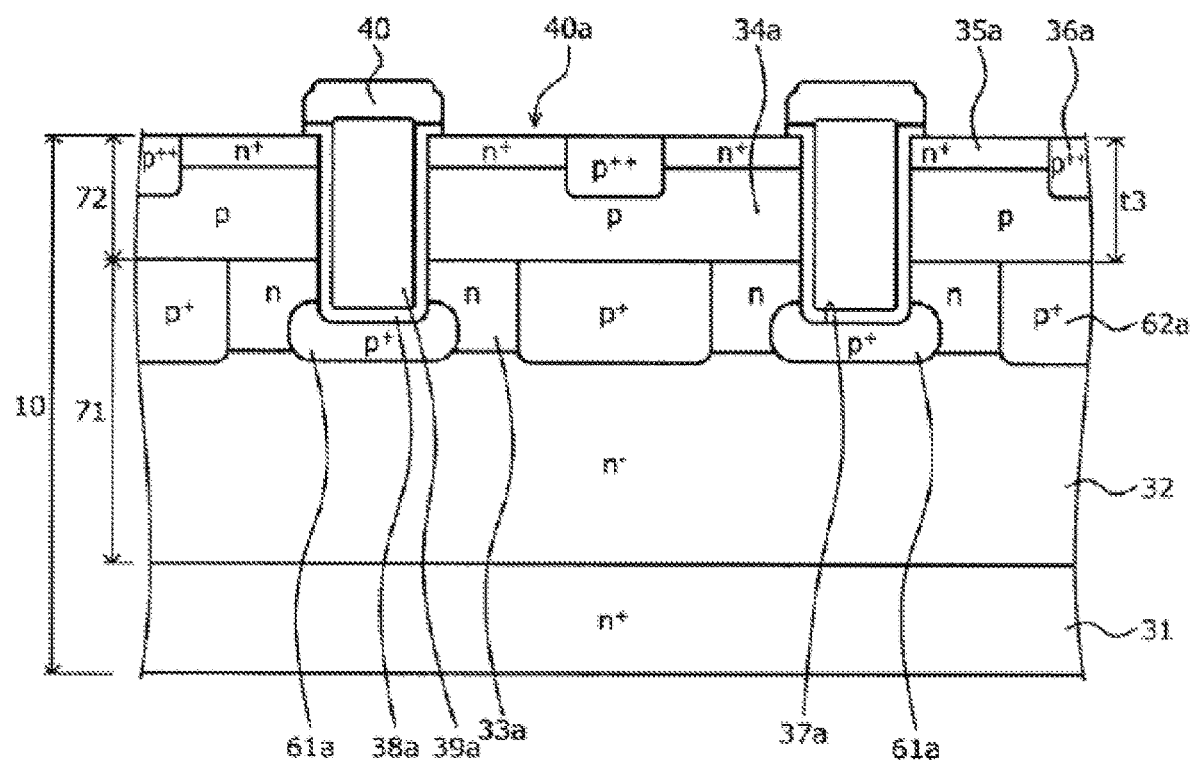
FIG. 14 is a cross-sectional view illustrating a state during manufacture of the semiconductor device according to Embodiment 1.

Next, as illustrated in FIG. 14, a gate insulating film 38a is formed on the front surface of the semiconductor substrate 10 and along the inner walls of the trenches 37a. The gate insulating film 38a may be a thermal oxidation film formed at a temperature of approximately 1000° C. in an oxygen ($O_2$) atmosphere or may be a deposited film made of a high temperature oxide (HTO), for example. Next, inside the trenches 37a, a phosphorus-doped polysilicon layer, for example, is formed on the gate insulating film 38a as gate electrodes 39a.

All of the devices other than the main semiconductor device 11 (the current sensor 12, a diffusion diode or the like which becomes the overvoltage protection unit, and complementary MOS (CMOS) devices of the arithmetic circuit, for example) as well as an n⁻ region 32b, a p-type base region 34b', and a second p⁺ region 62b' may be formed, in a main non-effective region 1b of the semiconductor substrate 10, at the same time as the corresponding components of the main semiconductor device 11 during the formation of those components of the main semiconductor device 11 as described above or independently at different times than during the formation of the components of the main semiconductor device 11.

For example, the diffusion regions arranged in the main non-effective region 1b of the semiconductor substrate 10 may be formed at the same time as diffusion regions having the same conductivity type, impurity concentration, and diffusion depth among the diffusion regions of the main semiconductor device 11. A sense effective region 12a and the p-type base region 34b' and second p⁺ region 62b' in the main non-effective region 1b are separated by the n⁻ region 32b. Moreover, the gate trenches, gate insulating film, and gate electrodes of the devices arranged in the main non-effective region 1b of the semiconductor substrate 10 may respectively be formed at the same time as the trenches 37a, the gate insulating film 38a, and the gate electrodes 39a in the main effective region 1a of the main semiconductor device 11.

Next, a field insulating film 80 is formed on the front surface of the semiconductor substrate 10, with this field insulating film 80 covering a region that does not include the main effective region 1a or the sense effective region 12a. When the temperature sensor is a polysilicon diode, a polysilicon diode (not illustrated in the figures) that will become the temperature sensor is formed on the field insulating film 80 in the main non-effective region 1b using a conventional method. At the same time as when the polysilicon diode that becomes the temperature sensor is formed, a first gate runner 23 for the main semiconductor device 11, a second gate runner 83, a polysilicon connecting portion 23a, and a polysilicon connecting portion 23b (see FIG. 1), all of which are made of polysilicon, are formed on the field insulating film 80 and on a layer underneath exposed by the field insulating film 80 in an edge termination region 2 using a conventional method. Thus, they are formed of the same polysilicon. In a plan view, an end portion of each gate electrode 39a is extracted towards and into the edge termination region 2, and the field insulating film 80 is not formed on the extracted end portion of the gate electrode 39a that passes beyond the second gate runner 83. At that location, the first gate runner 23 is connected to the respective gate electrodes 39a. Also, in a plan view, an end portion of each gate electrode 39b is extracted towards and into the edge termination region 2, and the field insulating film 80 is not formed on the extracted end portion of the gate electrode 39b. At that location, the polysilicon connecting portion 23b is connected to the respective gate electrodes 39b. Further, the polysilicon connecting portion 23a is connected to a pad made of the same polysilicon layer as the connecting part 23a, and is electrically connected to a gate pad 21b that is to be formed on the pad through a contact hole, which is described below. Here, instead of the above-described structure, by forming the field insulating film 80 before the formation of the gate insulating films 38a and 38b, the gate electrodes 39a and 39b, the first and second runners 23 and 83, and the polysilicon connecting portions 23a and 23b may be formed at the same time.

A second gate runner 83 and an internal resistor 81 may be formed at the same time as the first and second gate runners 23, 83. When a first portion 83a of the second gate runner 83 will be the internal resistor 81, the second gate runner 83 may be divided into first and second portions 83a and 83b using photolithography and etching, and the single first portion 83a may be used as the internal resistor 81. Moreover, the second portions 83b of the second gate runner 83 are selectively removed using photolithography and etching, and metal films 86 and 87 or the like are selectively layered in the areas in which the second portions 83b of the second gate runner 83 have been removed in order to form an internal coil 82.

When the internal coil 82 has a single-layer structure constituted by a single-layer metal film 86, after depositing the metal film 86 on the field insulating film 80, the metal film 86 may be patterned using photolithography and etching so as to be left remaining in a spiral shape. When the internal coil 82 has a multilayer structure constituted by a plurality of metal films 86 (86a to 86c), a process including depositing and patterning a metal film 86, depositing an interlayer insulating film 85 and forming a contact hole therein, and depositing and patterning a metal film 87 as a set may be repeated as many times as there are layers.

Next, interlayer insulating films 40 and 85 are formed over the entire front surface of the semiconductor substrate 10, with these interlayer insulating films 40 and 85 covering the gate electrodes 39a and 39b, the temperature sensor, the internal resistor 81, and the internal coil 82. The interlayer insulating films 40 and 85 may be phosphosilicate glass (PSG), for example. The thickness of the interlayer insulating films 40 and 85 may be approximately 1 μm, for example. Next, using photolithography and etching, the interlayer insulating films 40 and 85 as well as the gate insulating films 38a and 38b are selectively removed to form first and second contact holes 40a and 40b.

At this time, the first contact holes 40a are formed exposing the $n^+$ source regions 35a and the $p^{++}$ contact regions 36a of the main semiconductor device 11. In the sense effective region 12a, the second contact holes 40b are formed exposing $n^+$ source regions 35b and $p^{++}$ contact regions 36b of the current sensor 12. Then, the interlayer insulating film 40 is planarized (reflowed) using a heat treatment.

Next, using sputtering, for example, first TiN films 42a and 42b are formed over the entire front surface of the semiconductor substrate 10. The first TiN films 42a and 42b cover the entire front surface of the interlayer insulating film 40 and also cover the portions of the front surface of the semiconductor substrate 10 that are exposed by the first and second contact holes 40a and 40b (the $n^+$ source regions 35a and 35b and the $p^{++}$ contact regions 36a and 36b).

Next, using photolithography and etching, the portions of the first TiN films 42a and 42b that cover the semiconductor substrate 10 inside the first and second contact holes 40a and 40b are removed, thereby re-exposing the $n^+$ source regions 35a and 35b and the $p^{++}$ contact regions 36a and 36b. As a result, the first TiN films 42a and 42b are left remaining over the entire front surfaces of the interlayer insulating films 40 and 85 as barrier metals 46a and 46b.

Next, using sputtering, for example, an Ni film (not illustrated in the figures) is formed on the semiconductor portions (the front surface of the semiconductor substrate 10) exposed by the first and second contact holes 40a and 40b. At this time, the Ni film is also formed on the first and second TiN films 42a and 42b. Then, using a heat treatment performed at approximately 970° C., for example, the contact locations between the Ni film and the semiconductor portions are silicidized to form NiSi films 41a and 41b in ohmic contact with the semiconductor portions.

During the heat treatment for silicidizing the nickel, having the first and second TiN films 42a and 42b arranged between the Ni film and the interlayer insulating films 40 and 85 makes it possible to prevent nickel atoms in the Ni film from diffusing into the interlayer insulating films 40 and 85. The portions of the Ni film that are on the interlayer insulating films 40 and 85 are not in contact with the semiconductor portions and therefore do not undergo silicidation. Then, the portions of the Ni film that are on the interlayer insulating films 40 and 85 are removed to expose the interlayer insulating films 40 and 85.

Next, an Ni film, for example, is formed on the rear surface of the semiconductor substrate 10. Then, using a heat treatment performed at approximately 970° C., for example, the Ni film is silicidized to form an NiSi film in ohmic contact with an $n^+$ drain region (the rear surface of the semiconductor substrate 10 (rear surface of the $n^+$ starting substrate 31)) as a drain electrode 51. This heat treatment for forming ohmic contact between the drain electrode 51 and the $n^+$ drain region may be performed at the same time as the heat treatment for forming the NiSi films 41a and 41b on the front surface of the semiconductor substrate 10.

Next, using sputtering, first Ti films 43a and 43b, second TiN films 44a and 44b, and second Ti films 45a and 45b which become part of the barrier metals 46a and 46b as well as an Al film (or an Al alloy film) which will become a source pad 21a, a gate pad 21b, an OC pad 22, an electrode pad of the overvoltage protection unit (not illustrated in the figures), and electrode pads of the arithmetic circuit (not illustrated in the figures) are layered in order on the front surface of the semiconductor substrate 10. The thickness of the Al film is less than or equal to approximately 5 μm, for example.

Next, using photolithography and etching, the metal films deposited on the front surface of the semiconductor substrate 10 are patterned to leave portions that become the barrier metals 46a and 46b, the source pad 21a, the gate pad 21b, the OC pad 22, the electrode pad of the overvoltage protection unit, and the electrode pads of the arithmetic circuit remaining. The formation of these metal films on the front surface of the semiconductor substrate 10 is performed in a state in which the temperature sensor is covered by a resist mask, for example. Then, the resist mask covering the interlayer insulating film 85 on the temperature sensor is removed.

Next, using photolithography and etching, the interlayer insulating film 85 is selectively removed to expose a p-type anode region and an n-type cathode region of the temperature sensor. Then, the interlayer insulating film 85 is planarized using a heat treatment. Next, an Al film (or an Al alloy film) is formed on the front surface of the semiconductor substrate 10 and patterned to form electrode pads for the temperature sensor. Then, using sputtering, for example, a Ti film, an Ni film, and a gold (Au) film, for example, are layered in order onto the surface of the drain electrode 51 to form a drain pad (not illustrated in the figures).

Next, using a chemical vapor deposition (CVD) process, for example, the front surface of the semiconductor substrate 10 is protected with a polyimide film. Then, a heat treatment (curing) is performed to cure the polyimide film. Next, using photolithography and etching, the polyimide film is selectively removed to form first protective films 49a and 49b that respectively cover the electrode pads as well as to form openings in these first protective film 49a and 49b.

Next, after performing conventional plating preprocessing, a conventional plating process is used to form plating films 47a and 47b on the portions of the electrode pads 21a, 21b, and 22 that are exposed by the openings in the first protective films 49a and 49b. At this time, the first protective films 49a and 49b function as masks that inhibit wetting and spreading of the plating films 47a and 47b. The thickness of the plating films 47a and 47b may be approximately 5 μm, for example. Then, a heat treatment (baking) is performed to dry the plating films 47a and 47b.

Next, using a CVD process, for example, a polyimide film that will become second protective films 50a and 50b is formed covering the boundaries between the plating films 47a and 47b and the first protective films 49a and 49b. Then, the polyimide film is cured. Next, using solder layers (not illustrated in the figures), terminal pins 48a and 48b are respectively bonded onto the plating films 47a and 47b. At this time, the second protective films 50a and 50b function as masks that inhibit wetting and spreading of the solder layers. Finally, the semiconductor substrate 10 is diced (cut) and divided into individual chips, thereby completing the semiconductor device 20 illustrated in FIGS. 1 to 6.

As described above, in Embodiment 1 the second gate runner for the current sensor is arranged surrounding the periphery of the active region on the front surface of the semiconductor substrate in the edge termination region, and the gate electrodes of the current sensor are electrically connected to the first gate runner for the main semiconductor device via the second gate runner. This makes it possible to increase the gate capacitance of the current sensor by an amount proportional to the surface area of the second gate runner, thereby making it possible to reduce the transient voltage produced as the current sensor switches ON and OFF when a pulse-shaped gate voltage is applied to the gate pad. This, in turn, makes it possible to increase the ESD tolerance of the current sensor.

Moreover, in Embodiment 1 the internal resistor or the internal coil or both may be connected in series between the gate pad and the gate electrodes of the current sensor via the second gate runner. Connecting the internal resistor in series between the gate pad and the gate electrodes of the current sensor makes it possible to reduce the gate current of the current sensor. Connecting the internal coil in series between the gate pad and the gate electrodes of the current sensor makes it possible to reduce the gate current per unit time of the current sensor. This makes it possible to further reduce the transient voltage V produced as the current sensor switches ON and OFF when a pulse-shaped gate voltage is applied to the gate pad.

Embodiment 2

Figure 15:
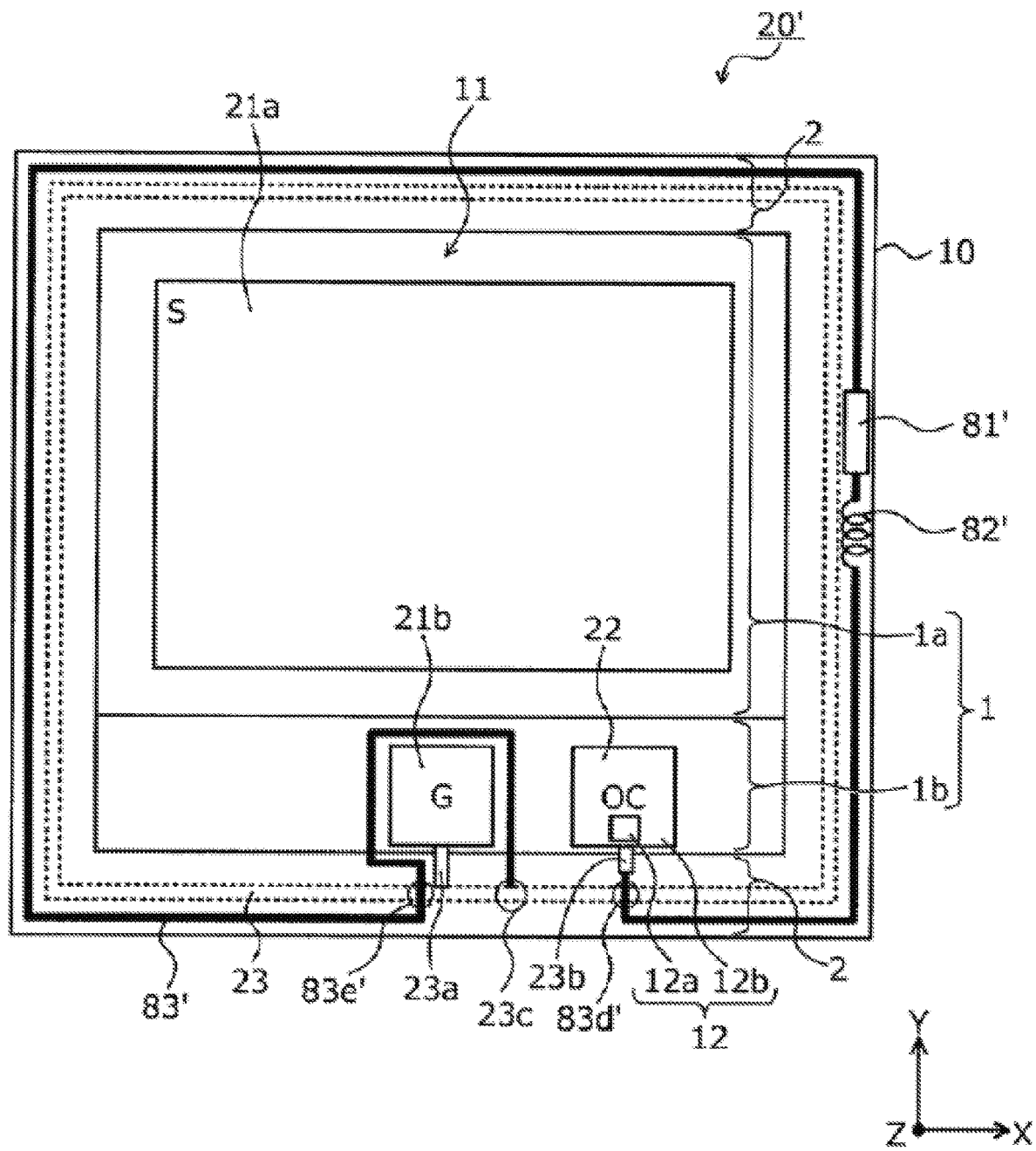
FIG. 15 is a plan view illustrating the layout of a semiconductor device according to Embodiment 2 as viewed from the front surface side of a semiconductor substrate.
Figure 16:
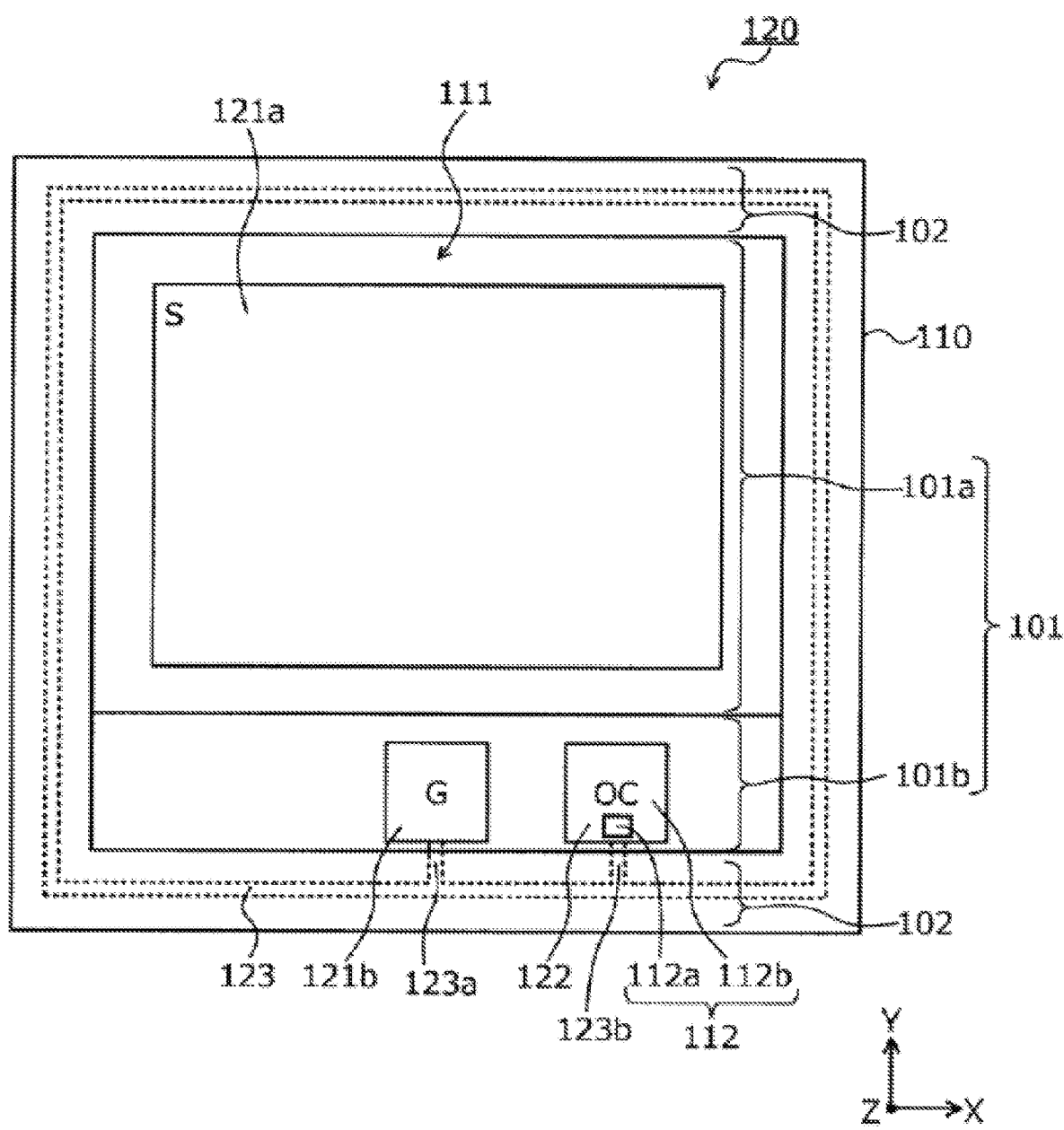
FIG. 16 is a plan view illustrating the layout of a conventional semiconductor device as viewed from the front surface side of a semiconductor substrate.

Next, a semiconductor device according to Embodiment 2 will be described. FIG. 15 is a plan view illustrating the layout of the semiconductor device according to Embodiment 2 as viewed from the front surface side of a semiconductor substrate. A semiconductor device 20' according to Embodiment 2 is different from the semiconductor device 20 according to Embodiment 1 (see FIGS. 1 to 6) in that a second gate runner 83', an internal resistor 81', and an internal coil 82' are arranged between the first gate runner 23 and the edges of the semiconductor substrate 10.

In Embodiment 2, the second gate runner 83' is arranged closer to the edge sides of the semiconductor substrate 10 than the first gate runner 23. As a result, in order to make the end of the second gate runner 83' extend further inwards than the first gate runner 23 and connect to the polysilicon connecting portion 23b, at least one position 83d' on the second gate runner 83' passes above the first gate runner 23.

At this position 83d' on the second gate runner 83' that passes above the first gate runner 23, the layered structure on the front surface of the semiconductor substrate 10 in the edge termination region 2 has a multilayer structure in which the second gate runner 83' is in a higher layer than the first gate runner 23 so that the first and second gate runners 23 and 83' are not connected to one another. Except for being arranged in a higher layer than the first gate runner 23, the second gate runner 83' has the same configuration as the second gate runner 83 of Embodiment 1.

Moreover, when making the second gate runner 83' connect to the first gate runner 23 from further inwards than the first gate runner 23 similar to in Embodiment 1 (at the location 23c), there is another position 83e' on the second gate runner 83' that passes above the first gate runner 23. Although this is not illustrated in the figure, the second gate runner 83' may be connected to the first gate runner 23 from further outwards than the first gate runner 23. In this case, the second gate runner 83' does not surround the periphery of the gate pad 21b.

The internal resistor 81' of Embodiment 2 has the same configuration as the internal resistor 81 of Embodiment 1 (see FIG. 3). In other words, the internal resistor 81' may be constituted by a portion of the second gate runner 83'. The internal coil 82' of Embodiment 2 has the same configuration as the internal coil 82 of Embodiment 1 (see FIGS. 4 to 6).

Thus, the same advantageous effects as in Embodiment 1 can also be achieved when the second gate runner, the internal resistor, and the internal coil are arranged between the first gate runner and the edges of the semiconductor substrate 10 as described above.

The present invention is not limited to the embodiments described above, and various modifications can be made without departing from the spirit of the present invention. For example, the layout of the main non-effective region in the active region can be modified in various ways, and the main non-effective region may be arranged near the center of the active region with the periphery thereof being surrounded by the main effective region. Moreover, the trench gate structures of the main semiconductor device and the current sensor may be replaced with planar gate structures, for example. Furthermore, instead of using silicon carbide as the semiconductor material, the present invention can also be applied to cases in which a wide-bandgap semiconductor other than silicon carbide is used as the semiconductor material. In addition, the present invention still exhibits all of the same advantageous effects even if the conductivity types (n-type and p-type) are inverted.

INDUSTRIAL APPLICABILITY

The semiconductor device according to the present invention as described above is useful in semiconductor devices which include a current sensor on the same semiconductor substrate as a main semiconductor device and is particularly well-suited to use in semiconductor circuit devices in which a plurality of semiconductor devices (semiconductor chips) are connected in parallel.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a semiconductor substrate made of a semiconductor having a wider bandgap than silicon, the semiconductor substrate having defined therein, in a plan view, a first device region and a second device region arranged side-by-side with each other, the first and second device regions together defining an active region, and an edge termination region surrounding the active region, located at an entire periphery of the semiconductor substrate;
    a first insulated-gate field-effect transistor formed in the semiconductor substrate, the first insulated-gate field-effect transistor having a plurality of cells that respectively have a plurality of gate electrodes;
    a first source pad for the first insulated-gate field-effect transistor formed on a first principal surface of the semiconductor substrate, the first source pad and the first insulating-gate field-effect transistor being located in the first device region in the plan view;
    a second insulated-gate field-effect transistor formed in the semiconductor substrate, the second insulated-gate filed-effect transistor having a plurality of cells that respectively have a plurality of gate electrodes and that have a same cell structure as the plurality of cells of the first insulated-gate field-effect transistor, the number of the cells in the second insulated-gate field-effect transistor being smaller than the number of the cells in the first insulated-gate field-effect transistor;
    a second source pad for the second insulated-gate field-effect transistor formed separated from the first source pad on the first principal surface of the semiconductor substrate, the second source pad and the second insulated-gate field-effect transistor being located in the second device region in the plan view;
    a first gate runner formed in the edge termination region on the first principal surface of the semiconductor substrate, the first gate runner being connected to all of the gate electrodes of the plurality of cells of the first insulated-gate field-effect transistor in the first device region;
    a second gate runner formed in the edge termination region on the first principal surface of the semiconductor substrate, one end of the second gate runner being connected to all of the gate electrodes of the plurality of cells of the second insulated-gate field-effect transistor in the second device region;
    a gate pad formed in the second device region, separated from the second source pad, on the first principal surface of the semiconductor substrate, the gate pad being connected to the first gate runner so as to be connected to all of the gate electrodes of the plurality of cells of the first insulated-gate field-effect transistors; and
    a drain electrode that makes ohmic contact with a second principal surface, opposite to the first principal surface, of the semiconductor substrate and that is shared by the first insulated-gate field-effect transistor and the second insulated-gate field-effect transistor,
    wherein the second gate runner extends from said one end thereof along a portion of a boundary between the second device region and the edge termination region and along an entire boundary between the first device region and the edge termination region, and
    wherein another end of the second gate runner is connected to the first gate runner so that the gate electrodes of the plurality of cells of the second insulated-gate field-effect transistor are electrically connected to the gate pad via the second gate runner and the first gate runner.

2. The semiconductor device according to claim 1, wherein the second gate runner surrounds a substantially entire periphery of the active region with said one end and said another end both terminating adjacent to a boundary between the second device region and the edge termination region, said another end of the second gate runner being connected to the first gate runner at a position adjacent to the boundary between the second device region and the edge termination region that is located between the gate pad and the second source pad.

3. The semiconductor device according to claim 1, further comprising a gate resistor inserted in the second gate runner, the gate resistor being formed in the edge termination region on the first principal surface of the semiconductor substrate.

4. The semiconductor device according to claim 3,
    wherein the second gate runner is a polysilicon pattern, and
    wherein the gate resistor is constituted by a portion of the polysilicon pattern of the second gate runner.

5. The semiconductor device according to any one of claim 1, further comprising an inductor inserted in the second gate runner, the inductor being formed in the edge termination region on the first principal surface of the semiconductor substrate.

6. The semiconductor device according to claim 5, wherein the inductor is a coil constituted by a helix-shaped metal film that is formed on the first principal surface of the semiconductor substrate in the edge termination region.

7. The semiconductor device according to claim 1,
    wherein the first gate runner extends along an entire boundary between the active region and the edge termination region and surrounds an entire periphery of the active region, and
    wherein the second gate runner is arranged between the first gate runner and the active region.

8. The semiconductor device according to claim 1, wherein the plurality of cells of the second insulated-gate field-effect transistor are arranged within a region of the semiconductor substrate that is covered by the second source pad in the plan view.

9. The semiconductor device according to claim 1, wherein the second insulated-gate field-effect transistor detects overcurrent flowing through the first insulated-gate field-effect transistor.

10. The semiconductor device according to claim 1, further comprising a gate resistor and an inductor inserted in the second gate runner, the gate resistor and the inductor being connected in series with each other and being formed in the edge termination region on the first principal surface of the semiconductor substrate,
  wherein the second gate runner surrounds a substantially entire periphery of the active region with said one end and said another end both terminating adjacent to a boundary between the second device region and the edge termination region, said another end of the second gate runner being connected to the first gate runner at a position adjacent to the boundary between the second device region and the edge termination region that is located between the gate pad and the second source pad.

* * * * *